US011452230B2

(12) United States Patent
Paterra

(10) Patent No.: US 11,452,230 B2
(45) Date of Patent: Sep. 20, 2022

(54) RACK-MOUNTABLE SHIPPABLE NETWORK-ATTACHED COMPUTING DEVICE

(71) Applicant: Amazon Technologies, Inc., Seattle, WA (US)

(72) Inventor: Frank Charles Paterra, Kirkland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 19 days.

(21) Appl. No.: 16/537,228

(22) Filed: Aug. 9, 2019

(65) Prior Publication Data

US 2019/0373755 A1 Dec. 5, 2019

Related U.S. Application Data

(63) Continuation of application No. 15/257,788, filed on Sep. 6, 2016, now Pat. No. 10,383,250.

(51) Int. Cl.
*H05K 7/14* (2006.01)

(52) U.S. Cl.
CPC ......... *H05K 7/1497* (2013.01); *H05K 7/1491* (2013.01)

(58) Field of Classification Search
None
See application file for complete search history.

(56) References Cited

U.S. PATENT DOCUMENTS 3,999,818 A  12/1976 Schankler
4,026,615 A   5/1977 Tazaki et al.
4,478,464 A  10/1984 Williams
6,172,875 B1  1/2001 Suzuki et al.
6,597,576 B1  7/2003 Smith et al.
9,405,333 B1* 8/2016 Pine ...................... G06F 1/1656

(Continued)

OTHER PUBLICATIONS

Crystal, Rugged Servers (Sep. 27, 2014). Retrieved from the internet using waybackmachine:<URL:https://web.archive.org/web/20140927215800/http://www.crystalrugged.com/products/rugged-servers/> (Year: 2014).*

(Continued)

*Primary Examiner* — James Wu
*Assistant Examiner* — Christopher L Augustin
(74) *Attorney, Agent, or Firm* — Robert C. Kowert; Kowert, Hood, Munyon, Rankin & Goetzel, P.C.

(57) ABSTRACT

A network-attachable rack-mountable computing device is housed within a shippable enclosure and is configured to mount in a rack. The device may be initialized (e.g., prepared to receive data, and an updateable electronic shipping display set to a shipping destination) by a service provider and shipped, in accordance with a displayed destination address, as a self-contained shipping unit. The device may be coupled with other devices via coupling mechanisms included in an enclosure of the device and may be mounted in a rack at a destination via mounting brackets included in the enclosure of the device. The device may be installed onto a network at the destination and loaded with data. When the device is received back at the service provider, the data is transferred from the device to a service provider storage facility, wiped of data, and prepared to be sent out again.

20 Claims, 14 Drawing Sheets

(56) References Cited

U.S. PATENT DOCUMENTS

| | | |
|---|---|---|
| 9,851,764 B2 | 12/2017 | Harvilchuck et al. |
| 9,994,380 B1* | 6/2018 | Szeremeta ............ B65D 43/163 |
| 10,383,250 B1 | 8/2019 | Paterra |
| 2002/0067601 A1* | 6/2002 | Hsu ...................... H05K 7/1425 |
| | | 361/752 |
| 2003/0020380 A1 | 1/2003 | Clements et al. |
| 2005/0284033 A1 | 12/2005 | Chen |
| 2006/0180555 A1 | 8/2006 | Shih et al. |
| 2007/0124020 A1* | 5/2007 | Staples ................. G06Q 10/08 |
| | | 700/229 |
| 2008/0135705 A1 | 6/2008 | Chuang |
| 2008/0274725 A1 | 11/2008 | Tkachenko |
| 2009/0323568 A1* | 12/2009 | Hoffmann ............. H04W 84/10 |
| | | 370/310 |
| 2011/0078346 A1 | 3/2011 | O'Connor et al. |
| 2012/0087085 A1 | 4/2012 | Moore et al. |
| 2012/0169191 A1 | 6/2012 | Song et al. |
| 2012/0292267 A1 | 11/2012 | Goldenberg et al. |
| 2014/0021154 A1 | 1/2014 | Chen |
| 2014/0049144 A1 | 2/2014 | Han et al. |
| 2015/0058996 A1 | 2/2015 | Maxam et al. |
| 2015/0324745 A1* | 11/2015 | Goodall ................. G06Q 10/08 |
| | | 705/337 |
| 2016/0150659 A1 | 5/2016 | Chen et al. |
| 2017/0071071 A1 | 3/2017 | Tseng et al. |
| 2017/0079156 A1 | 3/2017 | Hsiao et al. |
| 2017/0332509 A1 | 11/2017 | Miyatsu |

OTHER PUBLICATIONS

Liza Zyga weblo, "Light-up Cereal Boxes Powered by Shelvers on Display at CES," Jan. 11, 2011, Phys.org 2003-2015, Science X Network, downloaded from http://phys.org/news/201101lightupcerealpoweredshelvesces.html, pp. 1-13.

U.S. Appl. No. 14/788,671, filed Jun. 30, 2015, Colin Laird Lazier et al.

* cited by examiner

RACK-MOUNTABLE SHIPPABLE NETWORK-ATTACHED COMPUTING DEVICE

This application is a continuation of U.S. patent application Ser. No. 15/257,788, filed Sep. 6, 2016, which is hereby incorporated by reference herein in its entirety.

BACKGROUND

Growth of data storage capacity and big data has far outpaced the rate of increase of data transmission bandwidth capable of transferring large quantities of data. In some instances transmitting large quantities of data from one storage facility to another storage facility may be prohibitively costly (e.g., requiring costly system upgrades) or lengthy (e.g., transmission taking months to years). Alternatively, in some instances, storage media currently storing large quantities of data may be physically moved to transfer large quantities of data between storage facilities. However, physically moving storage media storing large quantities of data may leave the data on legacy hardware or may not be an available option (e.g., when the data is stored at a storage facility operated by a storage service on behalf of a customer).

In some instances, data may be transferred between storage facilities using a storage device. The storage device may be shipped from one storage facility to another storage facility where the data is transferred to another storage system. However, transferring large quantities of data from a storage facility to another storage facility via shipping storage devices may involve placing multiple storage devices into multiple containers and placing labels on the containers. The packaging and labeling process involved in shipping multiple storage devices may provide numerous opportunities for human mistakes that prevent a correct storage device from being shipped to a correct destination. For example, a storage device may be inadvertently placed in a wrong box or a wrong label may be placed on a box. This may cause a storage device to not be received at its intended location. In addition, there are costs associated with packaging storage devices in containers and there are risks that storage devices may be damaged in transport if not properly packaged.

In some situations, customers of a storage service may operate in a facility that does not permit computing devices to be placed on a floor of the facility, such as a co-location facility. Such customers may require that any storage devices received by the customer be configured to mount in a rack.

Figure 1:
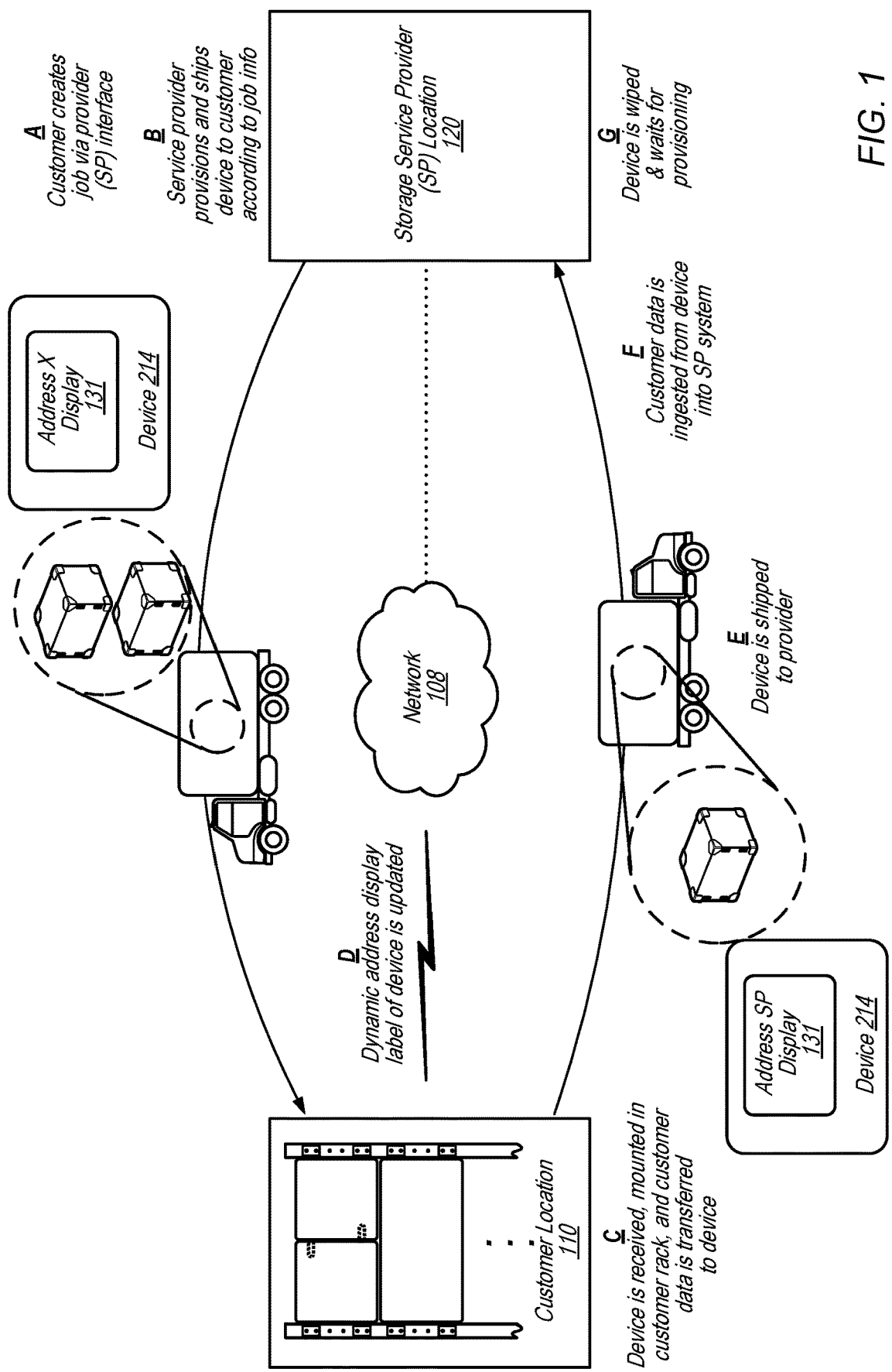
FIG. 1 illustrates a system and process for a rack-mountable shippable computing device, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments describe systems and processes associated with a rack-mountable shippable computing device that is configured to mount in a rack at a customer location and that includes an electronic shipping display that is used to display a destination shipping address of the rack-mountable shippable computing device.

In some embodiments, a system includes a rack and network-attachable data transfer devices mounted adjacent to one another in the rack. The network-attachable data transfer devices each include an enclosure, a persistent storage medium mounted within the enclosure, a network connection accessible through the enclosure, and a mounting bracket coupled to the enclosure. The network connection is configured to provide access to the persistent storage medium as a network-attached storage device. Also, the mounting bracket is configured to extend out from the enclosure when the network-attachable data transfer device is mounted in a rack and configured to be stowed in a portion of the enclosure when the network-attachable data transfer device is being transported. The network-attachable data transfer devices mounted adjacent to one another in the rack are physically coupled together such that the coupled data transfer devices substantially span a width of the rack. One of the coupled network-attachable data transfer devices is coupled with the rack on a first side of the width of the rack via an extended mounting bracket of the data transfer device. In addition, another one of the coupled data transfer devices is coupled with the rack on a second side of the width of the rack via an extended mounting bracket of the other one of the coupled network-attachable data transfer devices. For example, network-attachable data transfer devices may be coupled to each other and a mounting bracket of a left one of the coupled data transfer devices may couple with a left rail of a rack and a mounting bracket of a right one of the coupled data transfer devices may couple with a right rail of a rack to mount the coupled network-attachable data transfer devices in the rack via coupling the respective mounting brackets to the left and right rails of the rack. In some embodiments, the coupled network-attachable data transfer devices may substantially span a depth of the rack when coupled together and mounted in the rack. In other embodiments, a network-attachable data transfer device may be mounted in a perpendicular orientation wherein a mounting bracket on a front or back side of a length of the network-attachable data transfer device couples with a left rail of a rack and another mounting bracket on an other side of the length of the network-attachable data transfer device couples with a right rail of a rack. In such embodiments, the network-attachable data transfer device may not span a full depth of a rack when mounted in the rack.

In another embodiment, a computing device includes an enclosure, a storage medium mounted within the enclosure, and a mounting bracket coupled to the enclosure. The mounting bracket is configured to extend out from the enclosure and coupled with a rack when the computing device is mounted in the rack and configured to stow in a portion of the enclosure when the computing device is being transported. For example, a stowed mounting bracket stowed in a portion of the enclosure may be substantially flush with a surface of the enclosure such that the stowed mounting bracket does not substantially protrude out from the surface of the enclosure.

In another embodiment, a method includes receiving computing devices, coupling the computing devices together such that the computing devices substantially span a width of a rack, extending mounting brackets out from respective enclosures of respective ones of the coupled computing devices, coupling the extended mounting brackets to a rack to mount the coupled computing devices in the rack, and connecting respective network connections of each of the computing devices to a network, wherein the respective network connections are accessible through the respective enclosures of the computing devices, and wherein the respective network connections provide access to respective storage mediums of the respective computing devices.

In some instances, a self-contained device may include an enclosure suitable for shipping a rack-mountable computing device so that no additional packaging is necessary. For example, an enclosure of a rack-mountable shippable computing device may include an updateable electronic display that displays shipping information such that a carrier can scan or read the shipping information from the display and deliver the device to a destination based on the displayed shipping information. In some embodiments, a rack-mountable shippable computing device may be used for moving large amounts of data from one large data storage facility to another large data storage facility. For example, a rack-mountable shippable computing device may be used for moving data from one storage facility to another storage facility when data transmission networks cannot move the data fast enough. For instance, a petabyte of data can take years to transmit over some network connections, whereas transfer of the petabyte of data from a storage facility to a rack-mountable shippable transfer device may take days or less and physical shipment of the rack-mountable shippable computing device may be as fast as overnight. A rack-mountable shippable computing device may also be used for moving data from one storage facility to another facility when a highly secure means of transfer is required.

Some users of portable data transfer devices may desire to mount the portable data transfer devices in a rack. For example, some facilities, such as co-location facilities, may not permit computing devices to be placed on the ground and may require that computing devices installed at the co-location facility be mounted in racks. As another example, some users of portable data transfer devices may operate in facilities with limited amounts of space or with infrastructure resources designed to support computing devices mounted in racks. For such users, it may be desirable to mount portable data transfer devices in existing racks and utilize existing infrastructure resources to operate received portable data transfer devices.

In some embodiments, a rack-mountable shippable computing device may include mounting brackets configured to be stowed in a portion of an enclosure of the rack-mountable shippable computing device when the device is being shipped and configured to extend out from the enclosure to allow the rack-mountable shippable computing device to be mounted in a rack via the mounting brackets. In some embodiments, a rack-mountable shippable computing device may also include one or more coupling mechanisms configured to couple the device with other devices such that the coupled devices span a width of a standard width rack. For example, a rack may be a 19" standard rack in accordance with an Electronics Industries Alliance (EIA) standard for racks. Coupling multiple rack-mountable shippable computing devices together such that the devices span a width of a standard rack may reduce wasted space in the rack.

In some embodiments, a single rack-mountable shippable computing device may be configured to mount in a rack without coupling with other rack-mountable shippable computing devices or other devices. For example, a rack-mountable shippable computing device may have a length that substantially spans a width of a standard rack. The rack-mountable shippable computing device may include mounting brackets at opposite ends of the length of the device and the mounting brackets may be configured to couple with rails on opposite sides of a width of a standard rack. Also, in some embodiments, coupled sets of multiple rack-mountable shippable computing devices may substantially span a width of a standard rack and include mounting brackets on opposite ends of the set of coupled rack-mountable shippable computing devices. In such configurations, the mounting brackets may be configured to couple with rails on opposite sides of a width of a standard rack.

In some embodiments, a service provider may own or control rack-mountable shippable computing devices and may use the devices for import or export of data into or out of facilities that store data on behalf of a customer. For example, moving data from a customer to a storage service provider via a rack-mountable shippable computing device may be referred to as an import and moving data from a storage service provider to a customer via a rack-mountable shippable computing device may be referred to as an export. In some embodiments, data may be multicast, for example, sent from a customer to a storage service provider where the data is uploaded to a storage service and then the device is further shipped onto the customer's customers (e.g., via the device continuing on from the storage service provider, with the data, after data is uploaded at the storage service provider). A multi-cast scenario may apply in the export embodiment, as well. A multi-cast embodiment may refer to a single device being loaded with data at a source and then sent to multiple different destinations to distribute copies at the multiple different destinations or may refer to multiple different shippable computing devices being loaded with the same copy of data and each device being sent to a different destination. In some multicast embodiments, multiple different rack-mountable shippable computing devices, each device transferring a portion of a large amount of data, may be shipped as a group to a first destination and then onto another destination, leaving copies of the large amount of data at each destination (e.g., seeding different office's) before being returned to a service provider. A customer may request for export of data from the service provider storage network to multiple locations or customers, for instance.

For example, some large data storage facilities store large amounts of data, but have no way to transfer the large amounts of data external to the facility. In some instances, an enterprise storage facility may have grown over time with the data being used exclusively within the enterprise such that external data transmission facilities sufficient to reasonably move large amounts of data were never realized. Moving such large amounts of data to a cloud-based storage solution cost-effectively and in a timely manner may be difficult or even impossible.

In a particular example, moving big data (e.g., terabytes or petabytes of data or the like) from one storage facility to another storage facility may take months or years with current bandwidth solutions. An attractive alternative may be to locally transfer the big data to multiple rack-mountable shippable computing devices over a number of days or weeks at the one storage facility and then ship the multiple rack-mountable shippable computing devices to the other storage facility and locally transfer the big data from the multiple rack-mountable shippable computing devices to a destination storage system at the other storage facility.

In some embodiments, a rack-mountable shippable computing device may be mounted in a rack at a destination storage facility. While transferring data to or from a rack-mountable shippable computing device mounted in a rack, the rack-mountable shippable computing device may utilize existing infrastructure resources such as electrical power, cooling, and network connections of a destination storage facility.

In some embodiments, a rack-mountable shippable computing device may be equipped with an electronic display as part of or incorporated into the enclosure of the device. In some embodiments, the display may be a low-power display such as an electronic ink display and the display may be updated with any of various information, including destination addresses of where the device is to be shipped. Also, the device may be equipped with various sensors, such as a GPS sensor for tracking shipping progress of the device or environmental sensors such as accelerometers, temperature sensors, humidity sensors, pressure sensors, or the like. Data associated with the sensors may be displayed by the display. In some embodiments, the device may be ruggedized such that the device is less likely to be damaged during transit.

In some embodiments, a rack-mountable shippable computing device is configured such that a ruggedized enclosure, surrounding a persistent storage and incorporating an electronic display act as a self-contained whole. Such an arrangement may reduce shipping errors. For example, because the persistent storage, the display and the enclosure are coupled as a self-contained whole, it may not be possible to mismatch persistent storages intended for one container in a different container. Similarly, it may not be possible to mis-label the shippable unit (e.g., by putting the wrong label on the device) because the display is built into the shippable whole. Thus, errors associated with mismatched labels, containers, and items may be reduced by such a rack-mountable shippable computing device.

Various processes may be instituted by a service provider or customer that uses a rack-mountable shippable computing device, such as processes to keep data secure. For example, a service provider, such as a storage service provider with a number of devices, may implement a provisioning process that ties a particular rack-mountable shippable computing device to a particular request for data transfer services. The service provider may install security information on the device and direct the display of the device to display a shipping destination associated with the request and provide the device to a carrier as a self-contained shipping container.

In another process, such as when the customer that requested the service receives the rack-mountable shippable computing device, the customer may mount the device in a rack at a customer facility, connect the device to a customer network, and download a proprietary application corresponding to the device. When the application is executed by a customer computer on a customer network, the application may discover the connected device on the customer network and validate the computing device. In some embodiments, the application may be used to identify data on the customer network that is to be transferred to the device and the application may encrypt the identified customer data and load the encrypted data onto the device.

In some embodiments, destination information for the device may be automatically updated. For example, updated address information may be obtained over a customer network or from memory of the device and may be displayed on the electronic display. In some embodiments, the device may realize (e.g., based on a GPS sensor) that it is located at a customer location and change displayed address information from an address of the customer site to an address for a next destination. A customer may then provide the device to a carrier as a self-contained shipping container for shipment without any other additional packaging or labeling.

In another process, when a rack-mountable shippable computing device is received at a service provider (in accordance with an address or a code indicating an address displayed by the display) an ingestion process may be performed. For example, the rack-mountable shippable computing device may be connected to a service provider network, the data on the device may be decrypted and the data on the device may be stored via a storage service of the service provider. Subsequently, the rack-mountable shippable computing device may be prepared for re-use.

FIG. 1 illustrates a system and process for a rack-mountable shippable computing device with network-updateable electronic ink shipping display, according to some embodiments. The illustrated embodiment depicts movement of a rack-mountable shippable computing device from a service provider location 120 to a customer location 110 and back to the service provider location 120 as well as various processes A-G that are performed along the way by various entities. In some embodiments, the device 130 depicted in FIG. 1 may be the same as the device 130 depicted in FIGS. 2-6 and 13A-13B.

Customer location 110 is depicted in FIG. 1. But in some embodiments, a customer may have other locations and the rack-mountable shippable computing device 130 may be shipped to those locations instead of or in addition to customer location 110, before, or after the depicted shipment B. In some embodiments, multiple different rack-mountable shippable computing devices may be shipped to various locations at the same time as the depicted shipment. Rack-mountable shippable computing devices may be shipped to entities other than customers, for example but not limited to, other enterprise locations of an enterprise, government entities, other service providers or the like. Computers, such as a server or desktop computers at a customer location 110 may perform some or all of the processes illustrated in FIGS. 7 and 10, in some embodiments. Computers, such as a server or desktop computers at a service provider location 120 may perform some or all of the processes illustrated in FIGS. 8 and 12, in some embodiments.

Figure 5A:
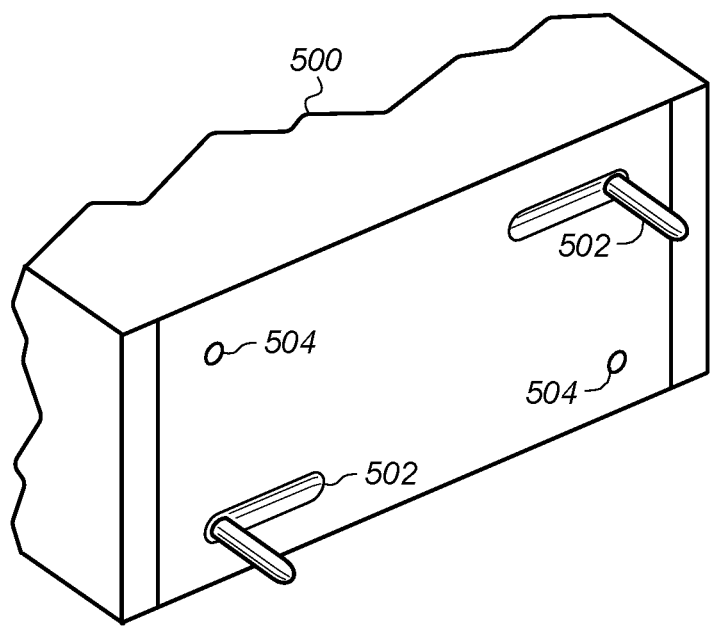
FIG. 5A is a perspective view of a rack-mountable shippable computing device showing a coupling mechanism of the rack-mountable shippable computing device in an extended position, according to some embodiments.
Figure 5B:
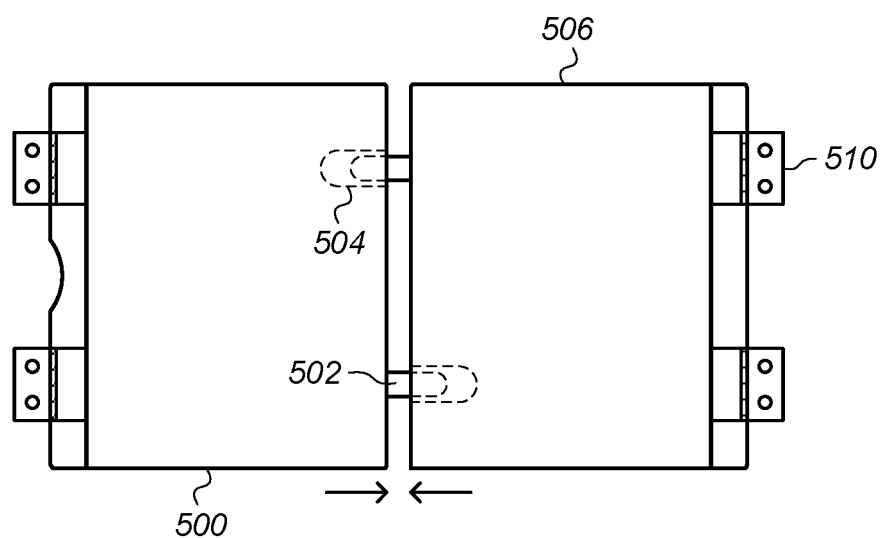
FIG. 5B illustrates a front view of two rack-mountable shippable computing devices being coupled together via coupling mechanisms of the two rack-mountable shippable computing devices, according to some embodiments.
Figure 6A:
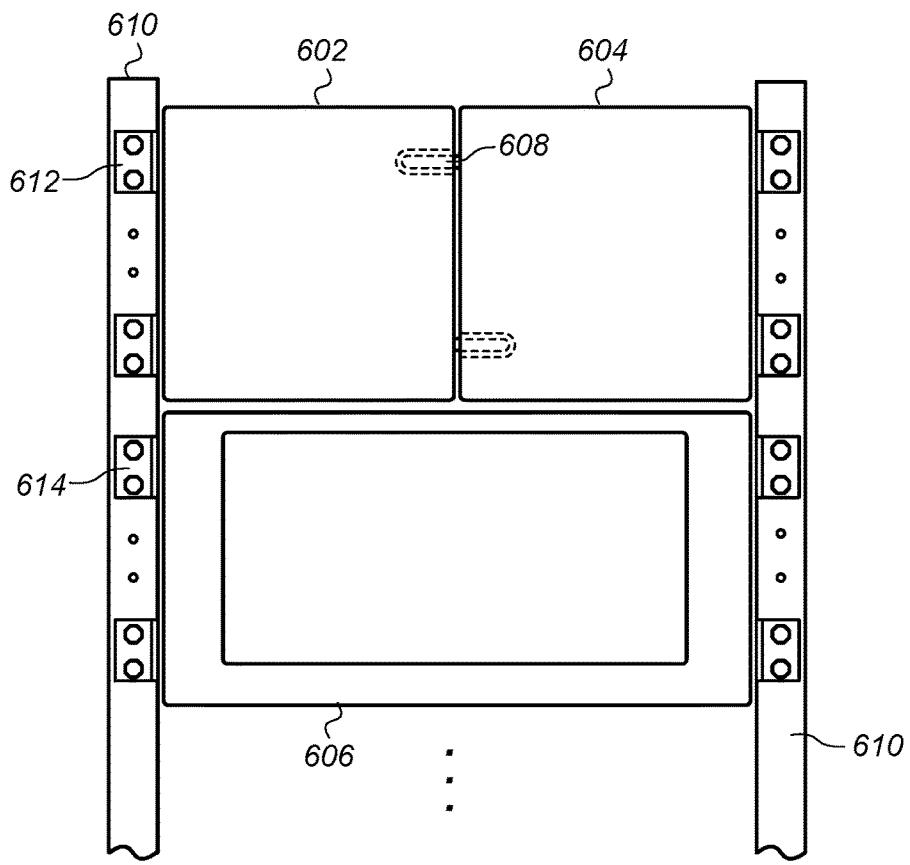
FIG. 6A is a front view of a rack with multiple rack-mountable shippable computing devices mounted in the rack, according to some embodiments.
Figure 6B:
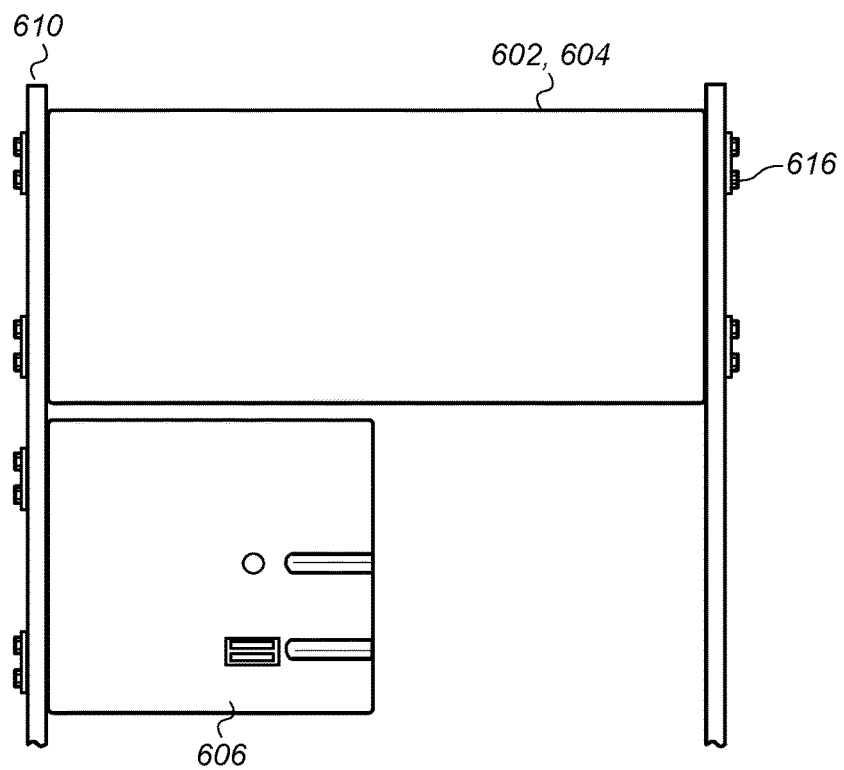
FIG. 6B is a side view of a rack with multiple rack-mountable shippable computing devices mounted in the rack, according to some embodiments.

Customer location 110 depicted in FIG. 1 may include racks, such as illustrated in FIGS. 6A-6B, and rack-mountable shippable computing devices may be mounted in racks at a customer location, such as customer location 110, as illustrated in FIGS. 4-6.

In FIG. 1 at item (A) a customer creates, generates or requests that a job be performed. The job creation or request may be performed via a console such as a network-based page or site of a service provider that the customer accesses via one or more networks (e.g., network 108). At (B) the service provider provisions a particular rack-mountable shippable computing device 130, instructs the device to display an address associated with customer location 110 (e.g., obtained during job creation (A)) and ships the device to the requesting customer according to job information (e.g., job information that may have been determined during generation of the job at request time, in some embodiments). At (C), the device is received at the customer location 110, the device is mounted in a rack at the customer location, and customer data is transferred to the device at the customer location. At (D) an electronic display of the device is updated with a new destination for the device. For example, the service provider may send an updated address via network 108, or the device may recognize it is at the customer location and automatically update the displayed destination address from a memory store programmed with the next destination during the provisioning step (B). At (E) the device is provided, by the customer to a shipping carrier and the device is shipped back to the service provider, for example the device is shipped back to service provider location 120. In some embodiments, the device may be sent to one or more other customer sites for additional data before being sent back to the service provider. At (F) the device is received back at the service provider, connected to a service provider network, and customer data is ingested from the device into the service provider system. At (G) the device is wiped and is stored until it is provisioned for another job.

Other various use-cases are contemplated. For example, a rack-mountable shippable computing device may be shipped onto other entities, such as a customer's customers after it has been received by, and the data uploaded at, a storage service provider. In some embodiments, a rack-mountable shippable computing device may be sent onto other customers distinct from the customer that sent the device to the storage service provider. In some embodiments, the device may be used to distribute the same data to multiple different sites of the same customer. The device may be instructed to display various addresses at various times, such that the device is used to multi-cast data, for example in either the export or import embodiments. It is contemplated that the various addresses may be stored on the device at once, such as when the device is provisioned or the various addresses may be sent to the device over a network, such as a cellular network or via a customer or provider network or combination thereof. In some embodiments, the device may include logic configured to update the displayed address based on the device sensing a geographical position or location of the device. For instance, a rack-mountable shippable computing device that determines (e.g., based on a GPS sensor or cellular triangulation) that it has arrived at one location, may be configured to display the next address stored in memory of the device.

Figure 2:
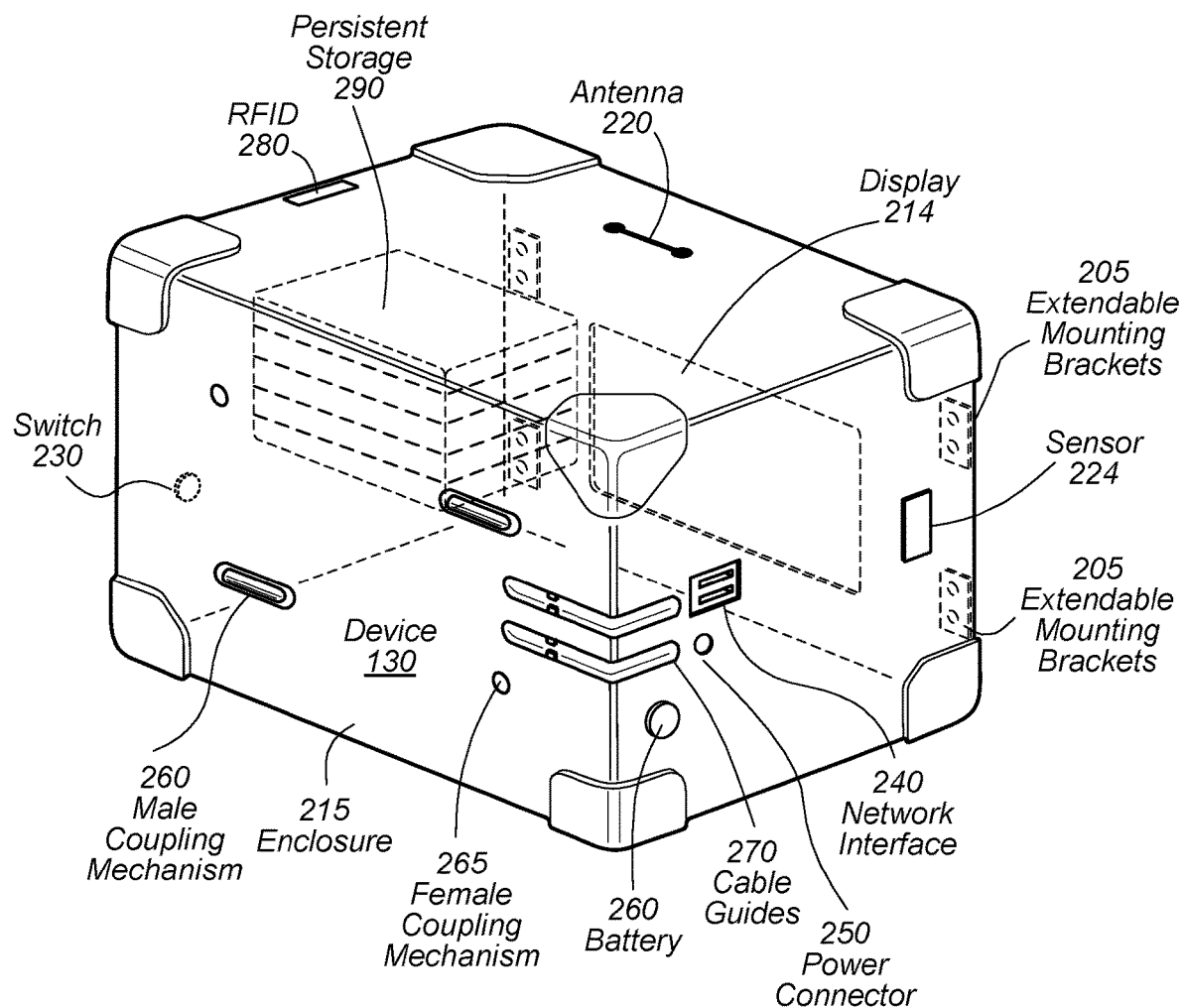
FIG. 2 illustrates a rack-mountable shippable computing device, according to some embodiments.

FIG. 2 illustrates a rack-mountable shippable computing device, according to some embodiments. The depicted rack-mountable shippable computing device 130 may be used to move large amounts of customer data off of customer storage networks or servers to other storage networks or servers, when other forms of transfer (e.g., broadband data transmission) are unavailable or cost or time prohibitive, as an example. In some embodiments, a rack-mountable shippable computing device may include more, less, or different features or components than those depicted.

In the depicted embodiment, rack-mountable shippable computing device 130 includes an enclosure 215 surrounding persistent storage 290. The persistent storage may include any type of storage such as, but not limited to hard disk drives, optical media, magnetic tapes, memristor storage, persistent RAM or solid state storage devices. The enclosure may be ruggedized (e.g., according to various standards, such as military standards or electronics industry standards) and may be configured with an outward-facing electronic display 214 such that when enclosed by the enclosure, the persistent storage, the enclosure, and the electronic display form a self-contained shipping container suitable for shipping without any additional packaging, labeling or the like and such that the electronic display 214 acts as to display a destination location (e.g., in lieu of a shipping label). In some embodiments, the enclosure 215 and the display 214 act as reusable shipping components in lieu of cardboard boxes and shipping labels. The enclosure may include various mechanisms to facilitate movement of the device 130, such as rollers, handles or the like.

In some embodiments, a rack-mountable shippable computing device, such as device 130, may include a coupling mechanism configured to couple the rack-mountable shippable computing device with other rack-mountable devices, such as other rack-mountable shippable computing devices. For example, device 130 includes male coupling mechanisms 260 and female coupling mechanisms 265. In some embodiments, extended male coupling mechanisms of a rack-mountable shippable computing device may be coupled with female coupling mechanisms of an adjacent rack-mountable device to couple the devices together. In some embodiments, male coupling mechanisms may be configured to extend out from a space in an enclosure, such as enclosure 215, when a device is to be coupled with another device, and may be stowed in the space in the enclosure when the device is not to be coupled or is to be transported. In some embodiments, various other types of coupling mechanisms may be used to coupled adjacent devices together, for example a tongue and groove coupling mechanism, a dovetail channel coupling mechanism, or other suitable coupling mechanism may be used.

Also, in some embodiments, a rack-mountable shippable computing device, such as device 130, may include extendable mounting brackets. Extendable mounting brackets, such as extendable mounting brackets 205, may be configured to be stowed in a space in an enclosure of a device, such as enclosure 215, and may be configured to extend out from the enclosure to mount a device, such as device 130, in a rack.

Device 130 is illustrated with battery 260 and power connection 250 for powering some or all of the components of the rack-mountable shippable computing device that require power to function. A power connector, such as connector 250, may be configured to connect a rack-mountable shippable computing device, such as device 130, to an external power source. In some embodiments, a power connector may power a persistent storage of a rack-mountable shippable computing device. Other sources of power are contemplated, such as kinetic energy sources that rely upon the motion during shipping to power the rack-mountable shippable computing device. In addition other power sources such as solar energy sources, or the like are contemplated. Any of various power sources may power the electronics (e.g., the display or the storage) of a rack-mountable shippable computing device, such as device 130.

In some embodiments, a power connector, such as power connector 250, may be located on a back side of a rack-mountable shippable computing device. For example, a switch, such as switch 230, may be located on a front side of a rack-mountable shippable computing device and a power connector, such as power connector 250, may be located on a back side of the device. Such an arrangement may allow power cabling to extend out from a rack-mountable shippable data storage device towards a back side of a rack when the device is mounted in the rack and may allow a switch, such as switch 230, to be operated from a front side of the rack, when the device is mounted in the rack.

In some embodiments, a rack-mountable shippable computing device may be mounted in a rack in a perpendicular orientation. In the perpendicular orientation, a length of a rack-mountable shippable computing device may be oriented along a width of a rack. Also, in the perpendicular orientation, power connector 250 may be on a left or right side of the device when the device is mounted in a rack and switch 230 may be on the opposite side of the device when the device is mounted in a rack. For example, in a non-perpendicular orientation, a rack-mountable shippable computing device may be mounted in a rack with a front side of the device on a front side of the rack and a back side of the device on a back side of the rack, wherein the length of the device runs from the front of the rack to the back of the rack. However, in a perpendicular orientation the front side and the back side of the rack may be oriented perpendicular to the front side and back side of the rack such that the front side of the device faces a left or right side of the rack and the back side of the device faces a left or right side of the rack and the length of the device runs from side to side of the rack.

When a rack-mountable shippable computing device is mounted in a rack in a non-perpendicular orientation, device controls, such as switch 230, may be accessible via a front of the rack. Also, cables connected to the device may be routed from the device into a space in a back of a rack. For example, cables connected to power connector 250 and network interface 240 may be routed in a space on a back side of a rack. However, in a perpendicular orientation, cables connected to power connector 250 and network interface 240 may also be routed to a space on a back side of a rack via cable guides, such as cable guides 270. In this way cables may be routed to a back side of a rack when the device is mounted in the rack in the non-perpendicular orientation or in the perpendicular orientation.

In some embodiments, extendable mounting brackets, such as extendable mounting brackets 205, may be partially extended (for example approximately 90 degrees) to mount a rack-mountable shippable computing device in a rack in a non-perpendicular orientation. In the non-perpendicular orientation extendable mounting brackets of a first one of a set of coupled devices may couple with a rack on a first side of a width of the rack and another set of extendable mounting brackets of another one of a set of coupled devices may couple with the rack on an other side of the width of the rack. In a perpendicular orientation, extendable mounting brackets may be extended further than in the non-perpendicular orientation (for example approximately 180 degrees) to mount a rack-mountable shippable computing device in a rack.

Device 130 is depicted with display 214. The display may incorporate any of various display technologies, such as low-power electronic-ink (E-ink), organic light emitting diodes (OLED), active-matrix organic light-emitting diode (AMOLED), flexible displays or touch-sensitive displays as non-limiting examples. Low-power e-ink displays may provide the benefit of reduced power consumption for a shipping environment where small batteries (e.g., batteries that cost less to ship, are less expensive, or take up less shipping space) are preferred. The device 130 may be configured with multiple displays 214, in some embodiments. For example, some carriers or fulfillment centers label three sides of a shipping container such that the destination of the container can be scanned or read irrespective of the orientation of the container. Similarly, multiple displays can be incorporated into multiple sides of the enclosure 215 of the device. For example, the enclosure may be configured with 1-6 or more displays, in some embodiments. The various displays may be configured such that the displays are computer readable (e.g., via scanner).

Device 130 is illustrated with network interface 240. The network interface 240 may act as an interface between the rack-mountable shippable computing device 130 and various networks, such as LANS, WANS or the like (e.g., via various protocols, such as iSCSI or Ethernet). In some embodiments, network connection 240 may act as an interface directly to another device (e.g., via SCSI).

Device 130 is illustrated with switch 230. The switch 230 may act as an on-off power switch or as a switch to activate the display, in some embodiments. Device 130 is also illustrated with antenna 220. The antenna may be configured to facilitate wireless communication between a service provider or customer and the device. For example, wireless communication may be over various cellular networks, Wi-Fi, or the like (e.g., network 108). For instance, a service provider may send updated address information to a rack-mountable shippable computing device 130 via cellular networks while the device 130 is en route to a location. The updated address information may be displayed via display 214 such that the device 130 is rerouted on the fly. In other embodiments, the wireless communication channel may be used to send updated shipping information for display while a rack-mountable shippable computing device is located at a customer site. In some embodiments, cellular networks may be used to track a rack-mountable shippable computing device.

Device 130 is also illustrated with radio frequency identification (RFID) 280. The RFID may assist with tracking the device, in some instances. For example, rack-mountable shippable computing devices may be identified during the provisioning process via a respective RFID or devices may be identified upon receipt at the customer or upon return to the service provider by a respective RFID. The RFID may be used to track a rack-mountable shippable computing device as the device is routed through a facility, such as through a service provider's fulfillment facility (e.g., while routed on a conveyor system).

In addition, device 130 is illustrated with various sensors 222, 224. The device may be outfitted with any of various sensors including a global positioning sensor (GPS), a temperature sensor, a humidity sensor or an accelerometer, all as non-limiting examples. Data may be collected from the sensors and used in various manners, such as to record the environment of the device (e.g., hot, cold, moderate, moist) or record various events associated with the device 130, such as a drop, quick movement, orientation or location of the device 130. Sensor data may be stored locally, sent over a network, such as network 108, or displayed via a display, such as display 214.

A rack-mountable shippable computing device, such as device 130, may be configured with multiple layers of security. For example, data stored on the device may be encrypted one or more times, with one or more keys. The keys may be determined, stored, controlled or held by various parties and applied at various steps of the illustrated processes. For example, some keys used to encrypt the data stored on the device may be stored separate from the device, while other keys used to encrypt the data on the device may be stored with the device. The encryption keys may be applied in multiple layers, in some embodiments.

In some embodiments, a device, such as device 130, may be configured as one or more other types of network-based devices or other electronic devices, such as transient local hardware for example. In an example, non-exhaustive list, device 130 may be configured as various combinations of cryptographic hardware and software (e.g., as a type 1 cryptographic device), as a storage gateway, as a web service, a firewall, a high-assurance guard, a server, virtual machine image, one or more dongles, a data warehousing solution or database service box, or the like.

Figure 3:
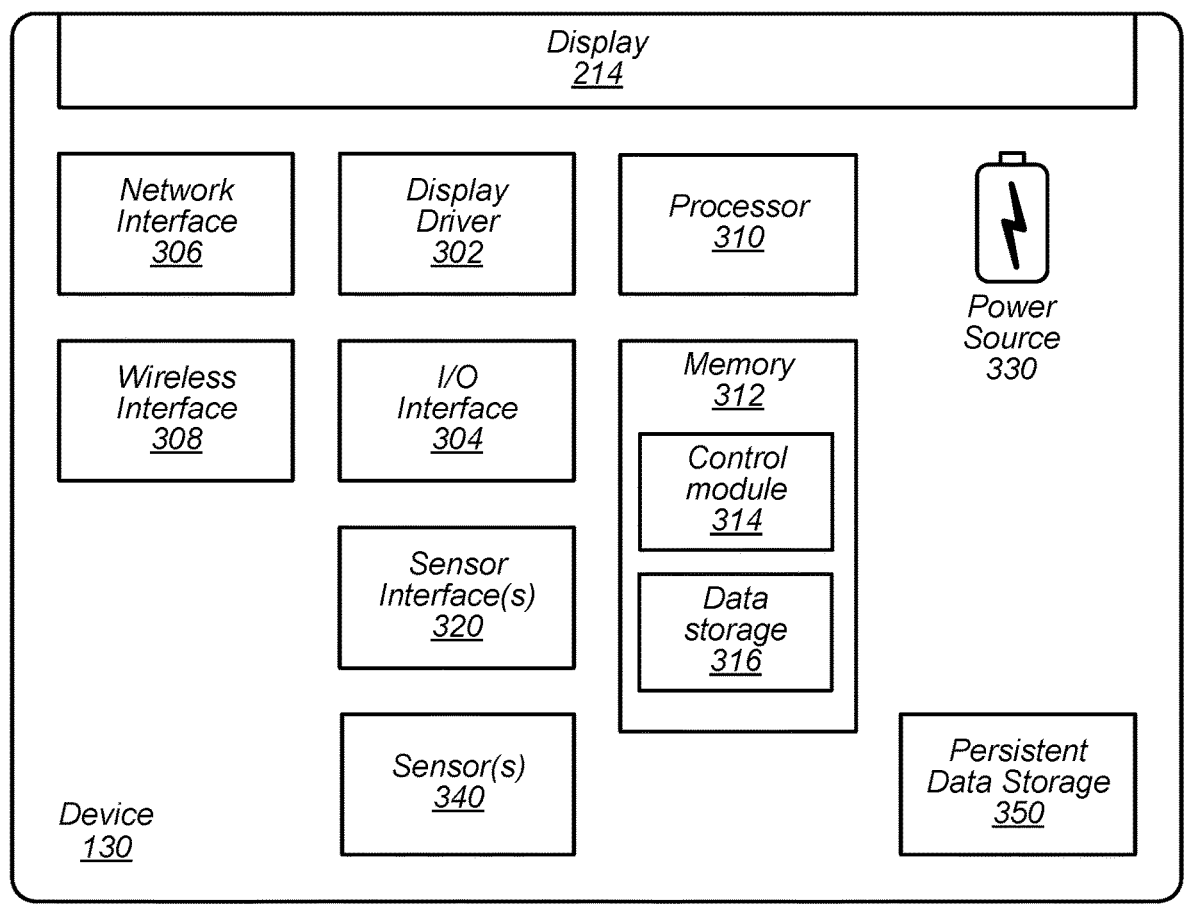
FIG. 3 is a schematic view of a rack-mountable shippable computing device, according to some embodiments.

FIG. 3 is a schematic view of a rack-mountable shippable computing device 130, according to some embodiments. FIG. 3 illustrates various components and modules of a rack-mountable shippable computing device 130. A rack-mountable shippable computing device may be configured with fewer or additional components or modules. Some component or module may be replaced by other component or modules. For example, the processor 310 and memory 312 may be replaced by firmware, in some embodiments. Various components or modules may perform some or all of the processes illustrated in the FIGs., in embodiments.

In FIG. 3, device 130 is illustrated with display 214, network interface 306 and persistent storage 350. In the illustrated embodiment, display driver 302 provides an interface function between a processor 310 and display 214. For example, to instruct the display to display an address, processor 310 executes computer instructions from memory 312 that send messages to display driver 302 that are interpreted by the display driver and cause the display driver to display the address on display 214.

Network interface 306 acts as an interface between an external network (e.g., a customer network or a service provider network or network 108) and the device. In some embodiments, the network interface is configured to transmit instructions to the device or to transmit encrypted data to the persistent storage 350. Wireless interface 308 may be configured to receive (e.g., via cellular or Wi-Fi network) instructions from the service provider. For example, the service provider 120 may send updated address information to the device 130 via a cellular network such that the displayed address of the device is updated en route, thereby changing the destination for the device in-flight such that the device is shipped to the updated address instead of the prior address.

Input/Output (I/O) interface 304 may be configured to coordinate I/O traffic between processor 310, memory 312, the display driver 302, network interface 306, wireless interface 308, sensor interface(s) 320 and persistent storage 350 or a peripheral interface. In some embodiments, I/O interface 304 may perform any necessary protocol, timing or other data transformations to convert data signals from one component (e.g., system memory 312) into a format suitable for use by another component (e.g., processor 310). In some embodiments, I/O interface 304 may include support for devices attached through various types of peripheral buses, such as a variant of the Peripheral Component Interconnect (PCI) bus standard or the Universal Serial Bus (USB) standard, for example. In some embodiments, the function of I/O interface 304 may be split into two or more separate components, such as a north bridge and a south bridge, for example. Also, in some embodiments, some or all of the functionality of I/O interface 304, such as an interface to system memory 312, may be incorporated directly into processor 310.

Device 130 is depicted with persistent data storage 350. Persistent data storage 350 may include any combination of non-volatile storage such as hard drives or flash memory. Persistent storage 350 may be configured (e.g., during a provisioning process) to store large amounts of encrypted data (e.g., from a large data store such as a customer storage system) during shipment from the customer location to a service provider location where the data is transferred to a service provider storage system.

Device 130 is depicted with power source 330 that may power the various electronic components of the device 130 and with sensor(s) 340 and sensor interface(s) 320. As described above, any of various sensor(s) may be incorporated into device 130. Device 130 may also include various sensor interface(s) 320 that act as an interface between the sensor(s) 340 and I/O interface 304. The sensor interfaces may be proprietary interfaces, or customized for a particular sensor, in some embodiments. The sensor interfaces may perform various functions such as conversions of data, analysis of sensor output and output of information based on the analysis or the like.

Figure 4A:
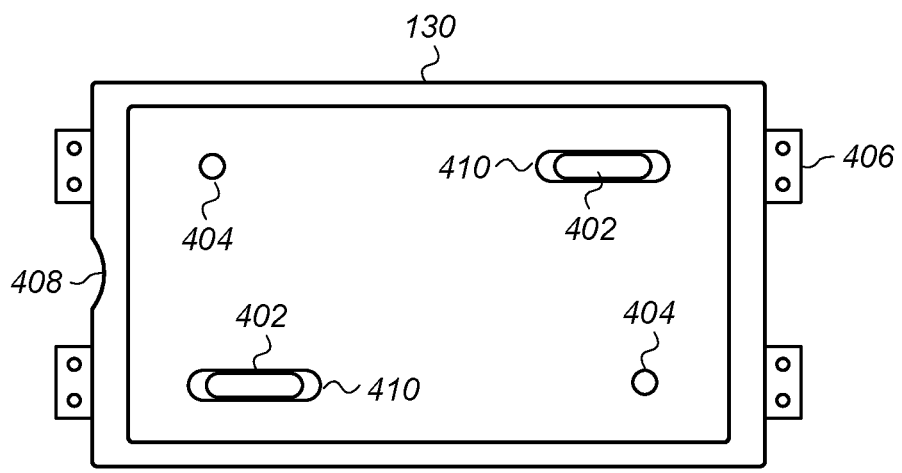
FIG. 4A is a side view of a rack-mountable shippable computing device showing a coupling mechanism of the rack-mountable shippable computing device, according to some embodiments.

FIG. 4A is a side view of a rack-mountable shippable computing device showing a coupling mechanism of the rack-mountable shippable computing device, according to some embodiments. Device 130 includes male coupling mechanisms 402 stowed in spaces 410 and female coupling mechanism 404. Also, device 130 includes mounting brackets 406 in an extended position, for example for mounting device 130 in a perpendicular orientation. Device 130 also includes cable guide 408 configured to accept and route a cable from a back side of device 130 to another side of device 130. Device 130 may be equivalent to device 130 described in FIGS. 1-3.

Figure 4B:
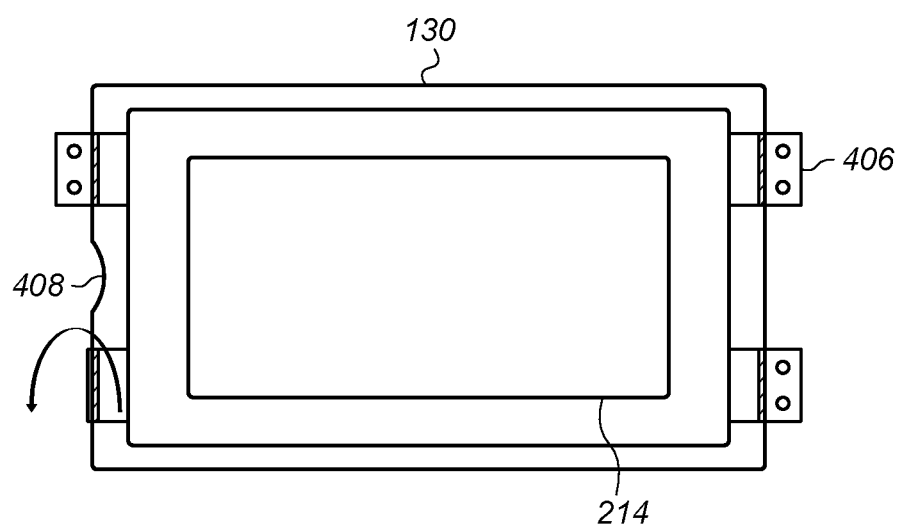
FIG. 4B is a side view of a rack-mountable shippable computing device showing a network-updateable electronic ink shipping display of the rack-mountable shippable computing device, according to some embodiments.

FIG. 4B is a side view of a rack-mountable shippable computing device showing a network-updateable electronic ink shipping display of the rack-mountable shippable computing device, according to some embodiments. Device 130 includes display 214, which may be the same as display 214 described in FIGS. 1-3. In FIG. 4B, mounting bracket 214 is shown in a partially extended position, such as would be used to couple device 130 to a rail of a rack when device 130 is mounted in the rack in a non-perpendicular orientation, for example when the device is coupled with one or more other devices that include mounting brackets partially extended in a similar manner as mounting bracket 412.

FIG. 5A is a perspective view of a rack-mountable shippable computing device showing a coupling mechanism of the rack-mountable shippable computing device in an extended position, according to some embodiments. Device 500 may be the same as device 130 illustrated in FIGS. 1-4. Male coupling mechanisms 502 are illustrated in FIG. 5 in an extended position and may be inserted into female coupling mechanisms, such as female coupling mechanisms 504, of an adjacent device.

FIG. 5B is a front view of two rack-mountable shippable computing devices being coupled together via coupling mechanisms of the two rack-mountable shippable computing devices, according to some embodiments. In FIG. 5B, an extended male coupling mechanism of device 506 is being coupled into female coupling mechanism 504 of device 500 and male coupling mechanism 502 of device 500 is being coupled into a female coupling mechanism of device 506. In some embodiments, coupling female and male coupling mechanisms of adjacent devices, such as adjacent rack-mountable shippable computing devices may couple the devices together such that the coupled devices can be mounted in a rack as a group of devices that spans a width of the rack. Also, partially extended mounting brackets of coupled devices may be oriented to couple with left and right rack rails on opposite sides of a width of a rack. For example, mounting brackets 508 may couple with a left rail of a rack and mounting brackets 510 may couple with a right rail of a rack. Device 506 may be the same as device 130 illustrated in FIGS. 1-4.

In some embodiments, other coupling mechanisms may be used to couple computing devices, such as devices 500 and 506, together. For example, device 500 may include a tongue that slides into a groove of device 506 to couple the devices together via a tongue and groove coupling mechanism. In another example, device 500 may have one or more raised channels along a length of device 500 that are configured to couple with corresponding indention channels along a length of device 506 to couple the devices together via a dovetail coupling mechanism. In some embodiments, raised channels and indentions channels of a dovetail coupling mechanism may include angled surfaces, such that a cross section of a raised channel has a dovetail shape. In some embodiments, other coupling mechanisms may be used, such as Velcro, or other suitable coupling mechanisms that provide sufficient rigidity to support the devices when the devices are coupled together and mounted in a rack via mounting brackets on either end of the coupled devices.

In some embodiments, some rack-mountable shippable computing devices may be mounted in a rack in a non-perpendicular orientation and other rack-mountable computing devices may be mounted in the same rack in a perpendicular orientation. For example, in some embodiments, rack-mountable shippable computing devices may be configured such that a pair of two devices spans a width of a standard rack and a customer may receive an odd number (i.e. a number other than 2, 4, etc.) of rack-mountable shippable data storage devices. The customer may mount the rack-mountable shippable data storage devices in pairs that span the width of the rack and mount the additional odd-numbered rack-mountable shippable computing device of in a perpendicular orientation.

FIG. 6A is a front view of a rack with multiple rack-mountable shippable computing devices mounted in the rack, according to some embodiments. In FIG. 6A, devices 602 and 604 are coupled together via coupling mechanisms 608 and mounted in rack 610 via partially extended mounting brackets 612. Device 606 is mounted in a perpendicular orientation via mounting brackets 614 that are extended further than mounting brackets 612.

FIG. 6B is a side view of a rack with multiple rack-mountable shippable computing devices mounted in the rack, according to some embodiments. As can be seen in the side view, devices 602 and 604 mounted in the non-perpendicular orientation may span the depth of rack 610 whereas device 606 mounted in the perpendicular orientation may only span a portion of the depth of rack 610.

In some embodiments, any suitable fastener may be used to mount a rack-mountable shippable computing device to a rack, such as screws, bolts, Allen bolts, etc. For example, devices 602, 604, and 606 are coupled with rack 610 via mounting brackets 612 and 614 and bolts 616.

Devices 602, 604, and 606 may be the same as device 130 illustrated in FIGS. 1-4.

Computing Device Lifecycle

Figure 7:
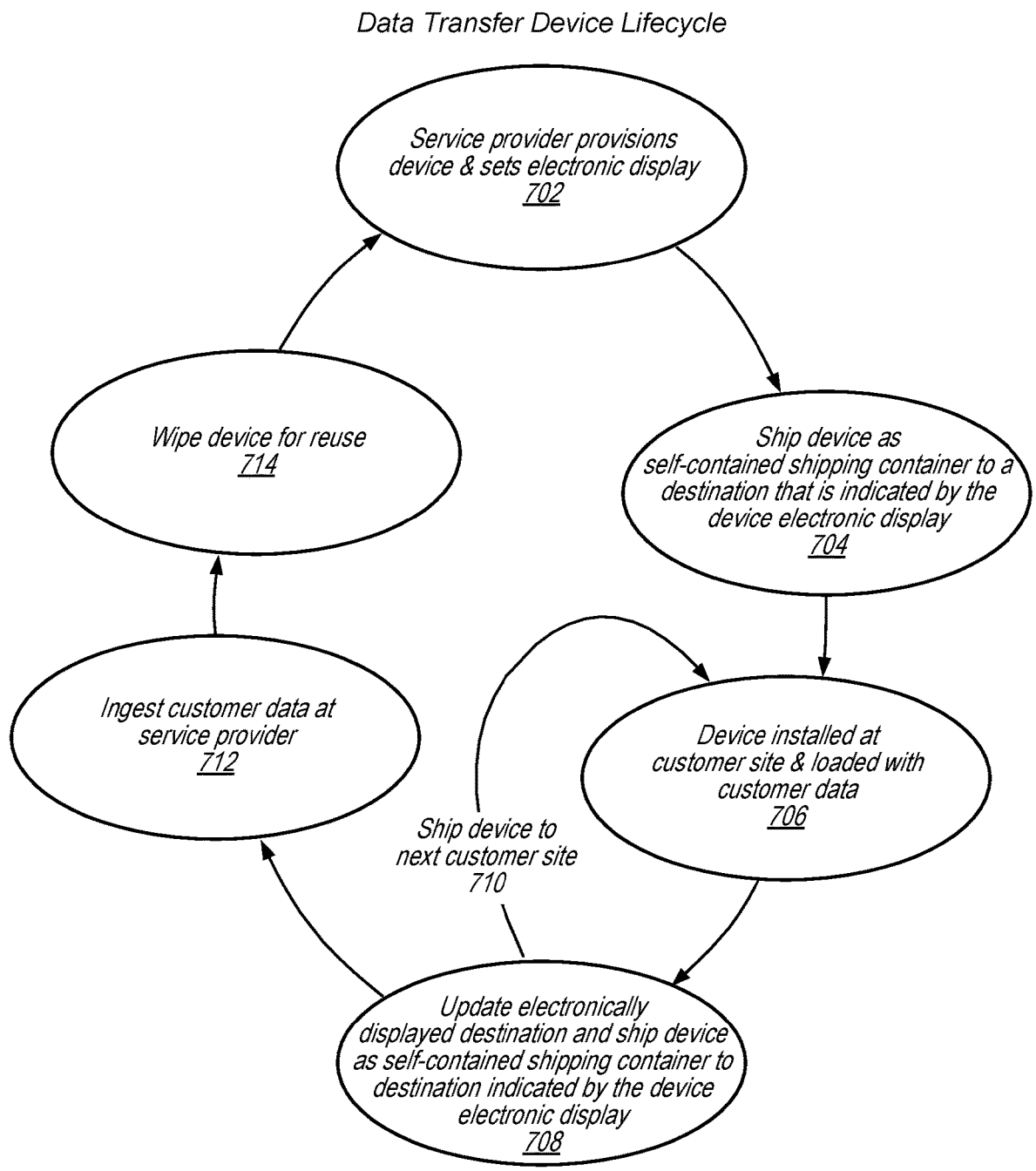
FIG. 7 is a flow diagram of a process of using a rack-mountable shippable computing device, according to some embodiments.

FIG. 7 is a flow diagram of a process of using a rack-mountable shippable computing device, according to some embodiments. FIG. 7 illustrates a computing device lifecycle, according to some embodiments. The illustrated process may be performed within the context of a rack-mountable shippable computing device 130, service provider 120 and customer location 110 as described in FIG. 1.

At 702, a service provider (e.g., service provider 120) provisions a rack-mountable shippable data transfer device (e.g., device 130) and sets an electronic display of the device. For example, the service provider may set the electronic display 214 (e.g., via the device user interface or via an external connection through the network interface) to display a customer destination address. In some embodiments, the service provider may also store a return address or the address of another customer facility in memory of the device such that the display can be updated with the stored address at some point.

At 704, the device 130 is shipped as a self-contained shipping container to a destination that is indicated by the device's electronic display. For example, the service provider may provide the device with the enclosure, the display, the persistent storage and the network interface to a common carrier without any additional packaging or labeling. The common carrier may ship the device through the carrier network to the destination without packaging or labeling in addition to the enclosure and electronic display, in embodiments.

At 706, the device is received at the customer site (e.g., customer location 110) the device is mounted in a rack at the customer location and installed onto a network at the customer site. Subsequently data is loaded onto the device 130. At 708, the electronically displayed destination may be updated and the device 130 may be removed from the rack at the customer location and shipped as a self-contained shipping container to the updated destination indicated by the device's electronic display. The display may be updated with a destination address or code that was stored in memory of the device 130 at provisioning or received over a network (network 108) while en route or at a customer location. The updated address may be a return address for returning the device to the service provider or an address of another location for the same or different customer (e.g., security provisions may be implemented such that data from multiple customers can be stored on the device).

At 710, the device is shipped to the next customer site, where the device can be mounted in another rack, installed in a customer network, and more data encrypted and loaded onto the device 130 (similar to 706). The process may continue through 708 and 710 one or more times until the device is updated with the service provider address and given to a carrier to ship to the service provider network location. At 712, the data from the device 130 is ingested or transferred into a storage service of the service provider 120. For example, the device is received by the service provider 120, connected to a service provider network, the data from the device unencrypted and the data stored to a service provider storage service.

At 714, the device is wiped of data (e.g., customer data and security information deleted or overwritten) and readied for reuse. The process may begin again at 702 and continue.

Figure 8:
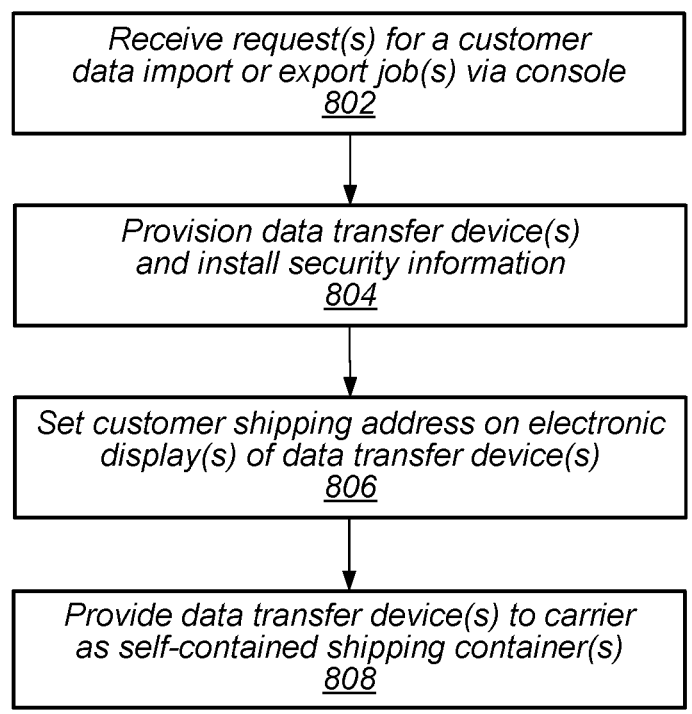
FIG. 8 is a flow diagram of a provisioning process associated with a rack-mountable shippable computing device, according to some embodiments.
Figure 9:
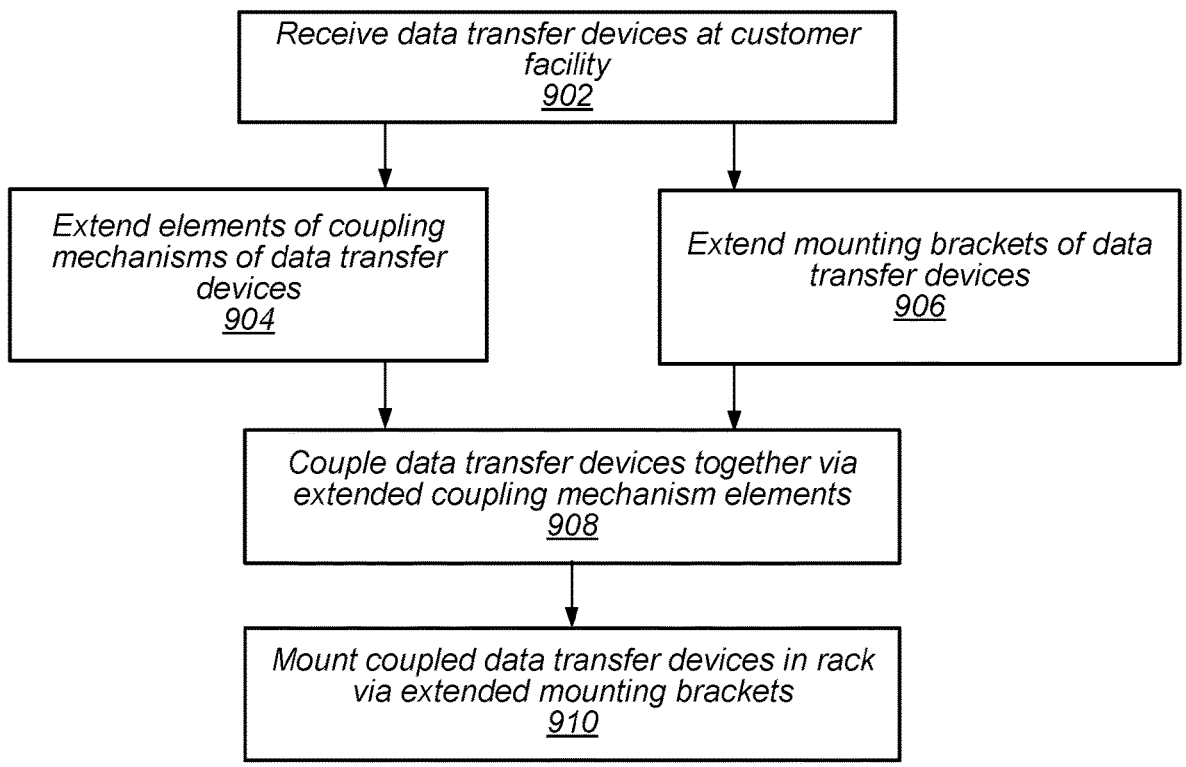
FIG. 9 is a flow diagram of a client-side installation process associated with a rack-mountable shippable computing device, according to some embodiments.
Figure 10:
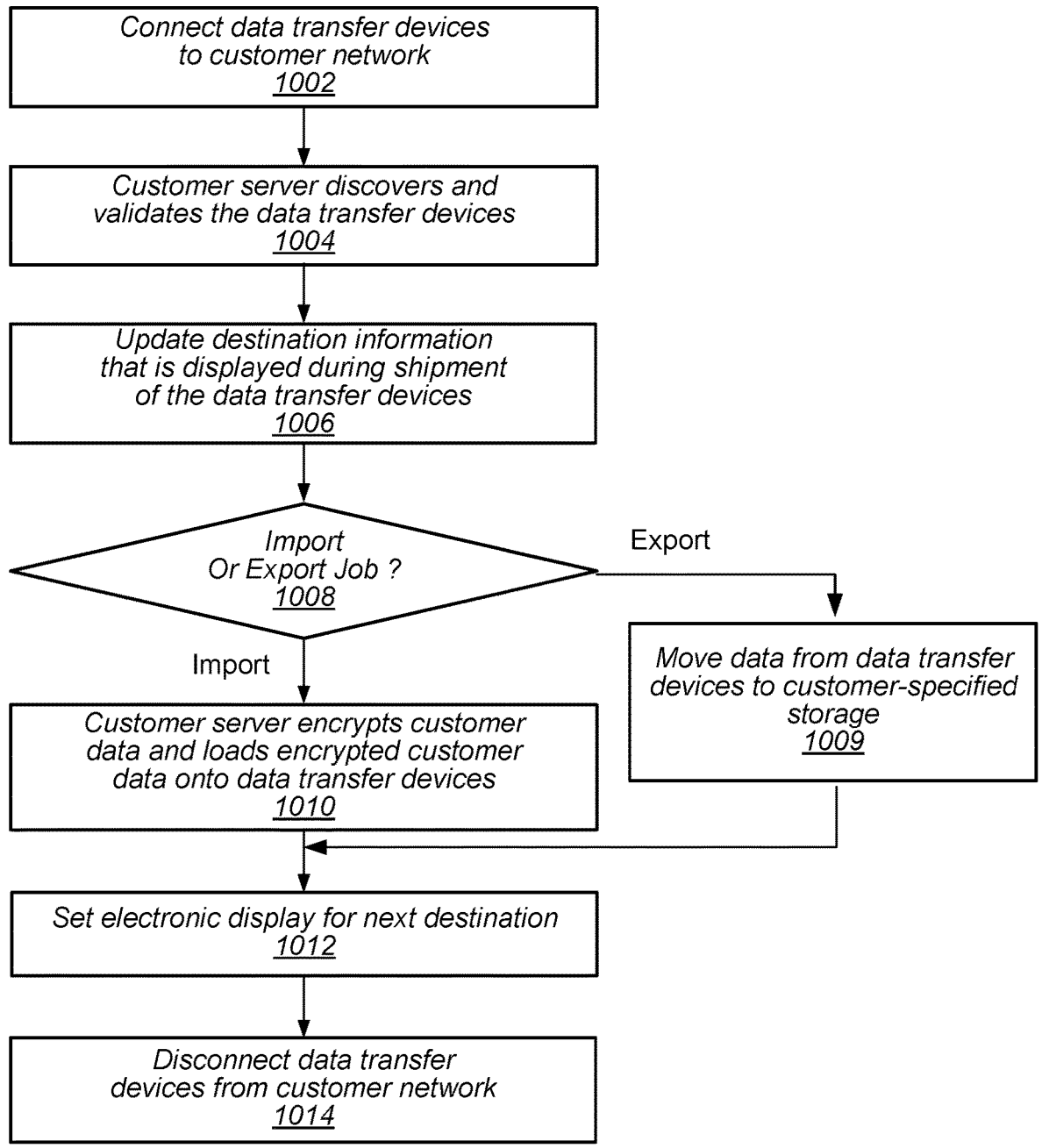
FIG. 10 is a flow diagram of a client side process associated with a rack-mountable shippable computing device at a customer location, according to some embodiments.
Figure 11:
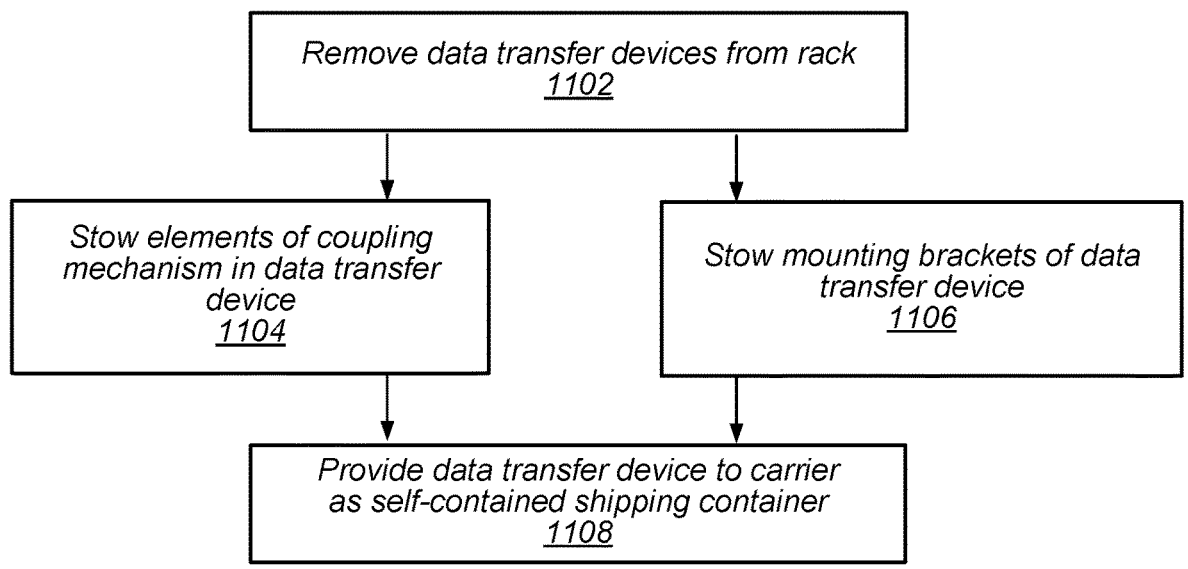
FIG. 11 is a flow diagram of a client-side uninstallation process associated with a rack-mountable shippable computing device, according to some embodiments.
Figure 12:
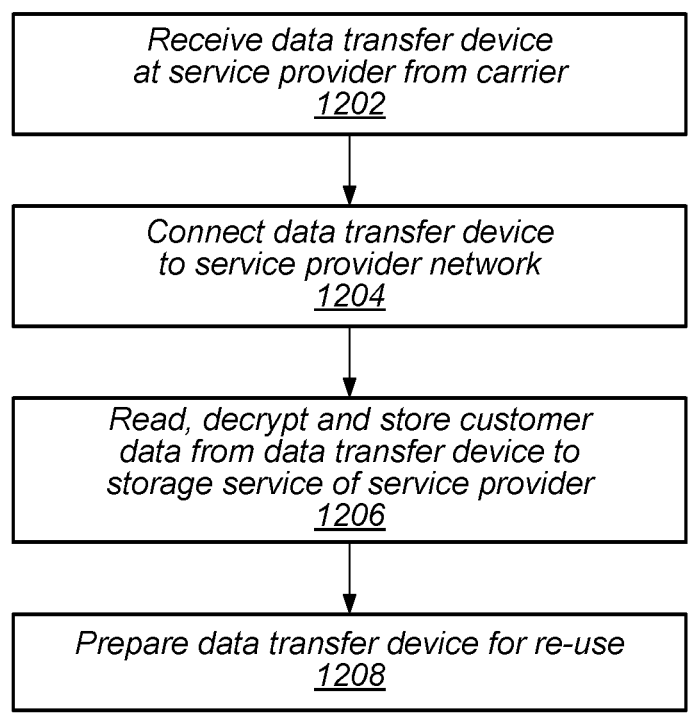
FIG. 12 is a flow diagram of a service provider data ingestion process associated with a rack-mountable shippable computing device, according to some embodiments.

FIGS. 8-12 illustrate various processes associated with device 130. FIG. 8 illustrates a provisioning process that may be performed by the service provider that associated a particular device 130 with a particular customer job. FIG. 9 illustrates a process of a customer mounting rack-mountable shippable data transfer devices in one or more racks at a customer location. FIG. 10 illustrates a customer-side process for connecting the device to the customer's storage, loading data onto the device, and updating the electronic display with the next destination. FIG. 11 illustrates a process of removing a rack-mountable shippable computing device from a rack at a customer facility and preparing the device to be shipped. FIG. 12 illustrates a process of off-loading data from the device that may be performed by the service provider when the device 130 is received back by the service provider. The illustrated processes depict alternative import/export embodiments where appropriate.

Provisioning

FIG. 8 is a flow diagram of a provisioning process associated with a rack-mountable shippable computing device, according to some embodiments. One or more portions of the illustrated process may be performed by one or more processes executing on a provider computer or network, in some embodiments. The illustrated process may be performed on device 130, illustrated in FIGS. 1-4, or similar devices illustrated in FIGS. 5-6.

At block 802, one or more requests are received for a customer data import or export job(s) via a console. The console may be configured to provide access and management of data transfer projects or jobs through a network-based user interface. The network-based user interface may be provided by the service provider, in some embodiments. The console may be configured to receive various project data from the customer and to provide that data to the service provider. The service provider may use the data as part of the provisioning process as well as part of an authentication process on the customer network when the device is connected to the customer network, in some embodiments.

At block 804, the rack-mountable shippable computing devices are provisioned and security information is installed on the devices. For example, particular computing devices may be removed from storage, associated with a customer project or job and loaded with keys, security certificates or the like such that the device 130 can be shipped to the customer that made the request.

In an export embodiment (e.g., when a customer requests to export data from a storage service provider system via the computing devices), data may be loaded from a storage network of the service provider onto the computing devices.

At block 806, the electronic display 214 of the rack-mountable shippable computing device 130 may be set with the customer-supplied shipping address (an address obtained via the console, for example). For example, the service provider may set the display via the network interface of the device. At block 808, the rack-mountable shippable computing devices 130 are provided to the carrier as self-contained shipping containers. For example, the rack-mountable shippable computing device may be provided to, and shipped by, a common carrier without any additional packaging or labeling beyond the enclosure and electronic display device. In some embodiments, the device 130 may be configured to receive commands from a common carrier or from the service provider that cause the device to display bar codes or the like that are used by the common carrier for routing the device through the carrier network.

FIG. 9 is a flow diagram of a client-side installation process associated with a rack-mountable shippable computing device, according to some embodiments. At 902 rack-mountable shippable computing devices are received at a customer facility. The devices may be shipped to the customer facility via a common carrier such as the United States Postal Service, UPS, FedEx, etc. In some embodiments, a single rack-mountable shippable computing device may be received at the customer facility or multiple rack-mountable shippable computing devices may be received at the customer facility.

At 904, if multiple rack-mountable shippable computing devices are received, elements of coupling mechanisms of the rack-mountable shippable computing devices are extended. For example, in some embodiments coupling mechanisms may include pins that are mounted via a pivot that allows the pins to rotate about the pivot to extend the pins out of a space in an enclosure of a rack-mountable shippable computing device in which the pins are stowed while the device is being transported. For example, coupling mechanisms may be extended in a similar manner as illustrated in FIG. 5A. In some embodiments, 904 may be omitted and a rack-mountable shippable computing device may be mounted in a rack in a perpendicular orientation without being coupled with another device.

At 906, mounting brackets of a rack-mountable shippable computing device are extended. In some embodiments, the mounting brackets may be extended partially if the device is to be mounted in a perpendicular orientation or may be further extended if the device is to be mounted in a non-perpendicular orientation.

If multiple rack-mountable shippable computing devices are to be mounted in a rack, at 908 the devices may be coupled together prior to being mounted in the rack via extended coupling mechanisms, such as the coupling mechanisms extended at 904. Multiple rack-mountable shippable computing devices may be coupled together in a similar manner as illustrated in FIG. 5B. In some embodiments, in which a single device or an odd number of devices is to be installed in a rack, 908 may be omitted.

At 910, a rack-mountable shippable computing device or a set of coupled devices including a rack-mountable shippable computing device are mounted in a rack via extended mounting brackets, such as the mounting brackets extended at 906. In some embodiments, a suitable fastener, such as a bolt, screw, etc., may be used to couple an extended mounting bracket with a rail of a rack. In some embodiments, a rack-mountable shippable computing device may be mounted in a standard EIA 19" rack. In some embodiments, a height of a rack-mountable shippable computing device may span one or more rack units when mounted in a standard rack. For example, a rack-mountable shippable computing device may have a height of 1 U, 1.5 U, 2 U. etc. when mounted in the non-perpendicular orientation or when mounted in the perpendicular orientation.

FIG. 10 is a flow diagram of a client side process associated with a rack-mountable shippable computing device at a customer location, according to some embodiments. Various portions of the process may be performed by a server or other computer on a customer network (e.g., customer location 110) as part of moving data from the customer network to device 130. In some embodiments, portions of the process may be performed by a downloaded proprietary application executing on the customers hardware. The proprietary application may be downloaded from the service provider, in some embodiments.

A rack-mountable shippable computing device is received from the carrier. For example, device 130 may be received at a customer site (e.g., customer location 110) from a common carrier. The rack-mountable shippable computing device is mounted in a rack at the customer location, for example, as described in FIG. 9. The computing device is connected to the customer network (block 1002). This may include physically connecting the device 130 to a network of the customer (e.g., via Ethernet or SATA or the like).

At 1004, the customer server (e.g., via execution of the downloaded application) discovers and validates the computing device. For example, the customer server may validate the computing device 130 based on one or more security certificates. At some point, the destination information that is displayed during shipment of the computing device may be updated (block 1006), via network 108, via cellular network, or based on a stored address within the device, for example.

If the job is an export job (e.g., exporting data from the service provider storage network via the computing devices), the data may be moved from the computing device to customer-specified storage (block 1009). If the job is an import job (e.g., importing data from the customer to the service provider), the customer server may encrypt the customer data and load the encrypted customer data onto the computing device (block 1010) and the electronic display may be set for the next destination (block 1012), based on the updated destination information, above, for example.

The computing device may be disconnected from the customer network (block 1014).

FIG. 11 is a flow diagram of a client-side uninstallation process associated with a rack-mountable shippable computing device, according to some embodiments. At 1102 one or more rack-mountable shippable computing devices are removed from a rack at a customer location. In some embodiments, fasteners, such as bolts, may be disengaged to remove a device from a rack in which the device is mounted. In some embodiments, devices may be coupled together via one or more coupling mechanisms and removing the rack-mountable shippable computing devices from the rack may further include de-coupling coupled devices.

At 1104 elements of a coupling mechanism, such as extended pins, are stowed in a space in an enclosure of a rack-mountable shippable computing device. For example, elements of a coupling mechanism may be stowed in a space of an enclosure as illustrated in FIG. 4A. In some embodiments, in which a rack-mountable shippable computing device is mounted in a rack as a single device in a perpendicular orientation, elements of a coupling mechanism of the device may already be stowed, and 1104 may be omitted.

At 1106 mounting brackets of the rack-mountable shippable computing devices are stowed in respective enclosures of the rack-mountable shippable computing devices. For example, mounting brackets may include a hinge that allows the mounting brackets to be extended out from an enclosure and rotated back into the enclosure to stow the mounting brackets.

At 1108 a rack-mountable shippable computing device may be provided to a carrier as a self-contained shipping container, as described herein. In some embodiments, the device 130 may be sent to another customer for more data to be loaded on the device before being sent back to the service provider (e.g., provider 120).

FIG. 12 is a flow diagram of a service provider data ingestion process associated with a rack-mountable shippable computing device, according to some embodiments. In embodiments, an application executing on the service provider 120 network performs some portion of all of the process illustrated in FIG. 12, after the device is received back from the customer 110, for example.

At block 1202, the rack mountable shippable computing device is received at the service provider from a carrier (e.g., as a self-contained shipping container 130). The data rack-mountable shippable computing device may be connected to the service provider network (block 1204) and the customer data from the computing device read, decrypted and stored to a storage service of the service provider (block 1206). The computing device may be prepared for re-use, the customer data and/or security information wiped from the persistent storage of device 130, for example.

Figure 13A:
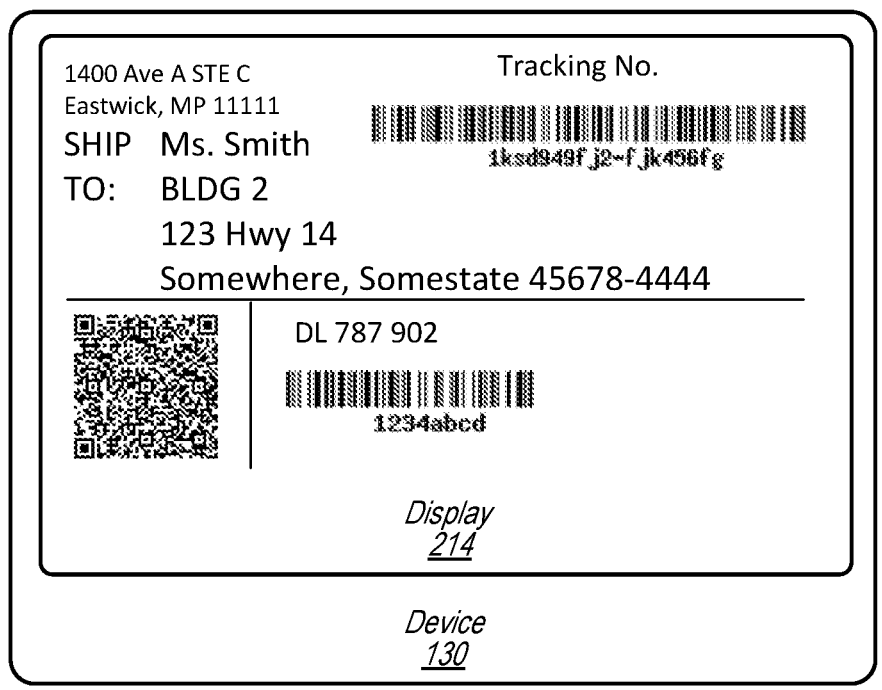
FIGS. 13A-13B illustrate various types of information displayed via an updateable electronic display of a rack-mountable shippable computing device, according to some embodiments.
Figure 13B:

FIGS. 13A-13B illustrate various types of information displayed via an updateable electronic display, according to some embodiments. The illustrated examples are applicable to various device embodiments including but not limited to those depicted in FIGS. 1-6 and described above.

FIG. 13A illustrates an updateable device display of a rack-mountable shippable computing device with network-updateable electronic ink shipping display. In the illustrated embodiment, the display 214 of device 130 is displaying sender (1400 Ave. A, STE C) and recipient address information (BLDG 2, 123 HWY 14), tracking information (e.g., tracking bar code and associated tracking no. 1ksd949 . . . ), a routing code DL 787 902 (e.g., tells how to route a package within a carrier network or facility), a postal bar code that features the zip code for the package's destination (e.g., 1234abcd), and a QR code that may encode various information (e.g., postal code, country code, service class (IDA etc.), tracking number, Julian date, package quantity and weight, address validation, and ship street, city and state).

In some embodiments, various information may be hidden or obscured or displayed in code, instead of directly displayed in the display. For example, addresses may be coded so as to obscure the destination from being readily recognizable without computer aid such as a scanner. For example, FIG. 13B illustrates an updateable device display of a shippable computing device with network-updateable electronic ink shipping display where the display 214 of device 130 is only displaying a single QR code. Any of various information may be encoded in the QR code and decoded via scanner or image processing device such as address information, or the like. In some embodiments, information may be hidden or obscured or not displayed according to geographical location. For example, the computing device may not display the address of the service provider while at the customer site and may instead display instructions to provide the rack-mountable shippable computing device to a carrier. The device may transition the display to display the address of the service provider once the device has left the customer premises, or may display a coded version of the destination address that is only computer readable, in embodiments.

Figure 14:
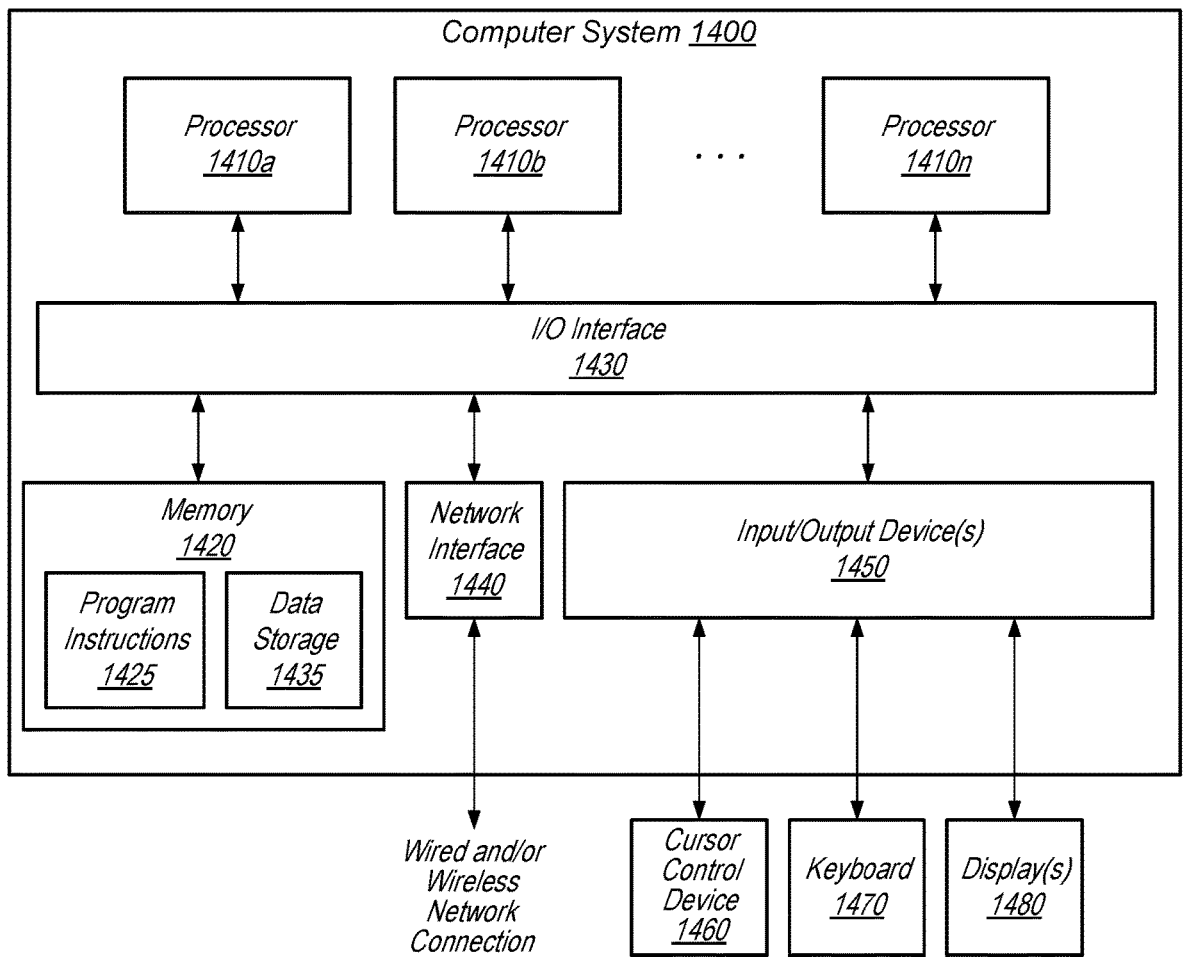
FIG. 14 is a block diagram illustrating an example computer system that implements some or all of the techniques described herein, according to different embodiments.

Any of various computer systems may be configured to implement the processes associated (e.g., provisioning or ingestion by the service provider or execution of the downloaded application on a customer server) with a rack-mountable shippable computing device with network-updateable electronic ink shipping display. For example, FIG. 14 is a block diagram illustrating one embodiment of a computer system suitable for implementing some of the systems and methods described herein. In various embodiments, the storage service of the service provider at the storage service location 120, or customer computers at enterprise location 110 (e.g., customer server) may each include a computer system 1400 such as that illustrated in FIG. 14.

In the illustrated embodiment, computer system 1400 includes one or more processors 1410 coupled to a system memory 1420 via an input/output (I/O) interface 1430. Computer system 1400 further includes a network interface 1440 coupled to I/O interface 1430. In some embodiments, computer system 1400 may be illustrative of servers implementing enterprise logic or downloadable application, while in other embodiments servers may include more, fewer, or different elements than computer system 1400.

In various embodiments, computer system 1400 may be a uniprocessor system including one processor 1410, or a multiprocessor system including several processors 1410 (e.g., two, four, eight, or another suitable number). Processors 1410 may be any suitable processors capable of executing instructions. For example, in various embodiments, processors 1410 may be embedded processors implementing any of a variety of instruction set architectures (ISAs), such as the x106, PowerPC, SPARC, or MIPS ISAs, or any other suitable ISA. In multiprocessor systems, each of processors 1410 may commonly, but not necessarily, implement the same ISA.

System memory 1420 may be configured to store instructions and data accessible by processor 1410. In various embodiments, system memory 1420 may be implemented using any suitable memory technology, such as static random access memory (SRAM), synchronous dynamic RAM (SDRAM), non-volatile/Flash-type memory, or any other type of memory. In the illustrated embodiment, program instructions and data implementing desired functions, such as those methods and techniques described above for the service provider or downloadable proprietary software are shown stored within system memory 1420 as program instructions 1425. In some embodiments, system memory 1420 may include data 1435 which may be configured as described herein.

In one embodiment, I/O interface 1430 may be configured to coordinate I/O traffic between processor 1410, system memory 1420 and any peripheral devices in the system, including through network interface 1440 or other peripheral interfaces. In some embodiments, I/O interface 1430 may perform any necessary protocol, timing or other data transformations to convert data signals from one component (e.g., system memory 1420) into a format suitable for use by another component (e.g., processor 1410). In some embodiments, I/O interface 1430 may include support for devices attached through various types of peripheral buses, such as a variant of the Peripheral Component Interconnect (PCI) bus standard or the Universal Serial Bus (USB) standard, for example. In some embodiments, the function of I/O interface 1430 may be split into two or more separate components, such as a north bridge and a south bridge, for example. Also, in some embodiments, some or all of the functionality of I/O interface 1430, such as an interface to system memory 1420, may be incorporated directly into processor 1410.

Network interface 1440 may be configured to allow data to be exchanged between computer system 1400 and other devices attached to a network, such as other computer systems, for example. In particular, network interface 1440 may be configured to allow communication between computer system 1400 and/or various I/O devices 1450. I/O devices 1450 may include scanning devices, display devices, input devices and/or other communication devices, as described herein. Network interface 1440 may commonly support one or more wireless networking protocols (e.g., Wi-Fi/IEEE 802.11, or another wireless networking standard). However, in various embodiments, network interface 1440 may support communication via any suitable wired or wireless general data networks, such as other types of Ethernet networks, for example. Additionally, network interface 1440 may support communication via telecommunications/telephony networks such as analog voice networks or digital fiber communications networks, via storage area networks such as Fibre Channel SANs, or via any other suitable type of network and/or protocol.

In some embodiments, system memory 1420 may be one embodiment of a computer-accessible medium configured to store program instructions and data as described above. However, in other embodiments, program instructions and/or data may be received, sent or stored upon different types of computer-accessible media. Generally speaking, a computer-accessible medium may include computer-readable storage media or memory media such as magnetic or optical media, e.g., disk or DVD/CD-ROM coupled to computer system 1400 via I/O interface 1430. A computer-readable storage medium may also include any volatile or non-volatile media such as RAM (e.g. SDRAM, DDR SDRAM, RDRAM, SRAM, etc.), ROM, etc., that may be included in some embodiments of computer system 1400 as system memory 1420 or another type of memory. Further, a computer-accessible medium may include transmission media or signals such as electrical, electromagnetic, or digital signals, conveyed via a communication medium such as a network and/or a wireless link, such as may be implemented via network interface 1440.

In some embodiments, I/O devices 1450 may be relatively simple or "thin" client devices. For example, I/O devices 1450 may be configured as dumb terminals with display, data entry and communications capabilities, but otherwise little computational functionality. However, in some embodiments, I/O devices 1450 may be computer systems configured similarly to computer system 1400, including one or more processors 1410 and various other devices (though in some embodiments, a computer system 1400 implementing an I/O device 1450 may have somewhat different devices, or different classes of devices).

In various embodiments, I/O devices 1450 (e.g., scanners or display devices and other communication devices) may include, but are not limited to, one or more of: handheld devices, devices worn by or attached to a person, and devices integrated into or mounted on any mobile or fixed equipment, according to various embodiments. I/O devices 1450 may further include, but are not limited to, one or more of: personal computer systems, desktop computers, rack-mounted computers, laptop or notebook computers, workstations, network computers, "dumb" terminals (i.e., computer terminals with little or no integrated processing ability), Personal Digital Assistants (PDAs), mobile phones, or other handheld devices, proprietary devices, printers, or any other devices suitable to communicate with device 130. In general, an I/O device 1450 (e.g., cursor control device, keyboard, or display(s) may be any device that can communicate with elements of computing system 1400. In one embodiment, at least some of the I/O devices 1450 may be configured to scan or otherwise read or receive codes or identifiers of various objects and to communicate the codes. Such components may include, but are not limited to, one or more of items, orders, containers or suitcases.

The various methods as illustrated in the figures and described herein represent illustrative embodiments of methods. The methods may be implemented manually, in software, in hardware, or in a combination thereof. The order of any method may be changed, and various elements may be added, reordered, combined, omitted, modified, etc. For example, in one embodiment, the methods may be implemented by a computer system that includes a processor executing program instructions stored on a computer-readable storage medium coupled to the processor. The program instructions may be configured to implement the functionality described herein (e.g., the functionality of the enterprise logic, packing service, product database, device and/or other communication devices, etc.).

Various modifications and changes may be made as would be obvious to a person skilled in the art having the benefit of this disclosure. It is intended to embrace all such modifications and changes and, accordingly, the above description to be regarded in an illustrative rather than a restrictive sense.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

What is claimed is:

1. A system, comprising:
    a rack; and
    a network-attachable data transfer device comprising:
        a ruggedized enclosure;
        a persistent storage medium mounted within the ruggedized enclosure;
        a network connection accessible at or through the ruggedized enclosure and configured to provide access to the persistent storage medium as a network attached storage device; and
        a mounting bracket coupled to the ruggedized enclosure, wherein the mounting bracket is configured to:
            extend out from the ruggedized enclosure when the network-attachable data transfer device is mounted in the rack; and
            stow in a portion of the ruggedized enclosure when the network-attachable data transfer device is being transported,
    wherein the network-attachable data transfer device is configured to be mounted in the rack:
        in a first orientation wherein a length of the network-attachable data transfer device is oriented along a depth of the rack; and
        in a perpendicular orientation wherein the length of the network-attachable data transfer device spans a width of the rack.

2. The system of claim 1, wherein the ruggedized enclosure and the persistent storage medium mounted within the ruggedized enclosure form a self-contained shipping container configured for shipping the network-attachable data transfer device to another location, via a common carrier, without additional packaging or labeling.

3. The system of claim 1, wherein the network-attachable data transfer device further comprises a coupling mechanism configured to physically couple the network-attachable data transfer device to another network-attachable data transfer device, wherein the coupling mechanism is configured to:
    extend out from the ruggedized enclosure of the network-attachable data transfer device and couple the network-attachable data transfer device with an adjacent network-attachable data transfer device mounted in the rack with the network-attachable data transfer device; and
    stow in a portion of the ruggedized enclosure of the network-attachable data transfer device when the network-attachable data transfer device is being transported.

4. The system of claim 1, wherein the network-attachable data transfer device is configured to couple with the rack, on a first side of the width of the rack, via an extended mounting bracket of the network-attachable data transfer device and couple with the rack, on a second side of the width of the rack, via another extended mounting bracket of the network-attachable data transfer device.

5. The system of claim 4, wherein the network-attachable data transfer device further comprises:
    a cable guide along a corner of the ruggedized enclosure of the network-attachable data transfer device, wherein the cable guide is configured to accept a cable and route the cable from a first side of the network-attachable data transfer device to another side of the network-attachable data transfer device when the network-attachable data transfer device is mounted in the rack.

6. The system of claim 1, wherein the network-attachable data transfer device comprises:
    an updateable electronic display incorporated into the ruggedized enclosure and visible external to the ruggedized enclosure to provide shipping destination information, wherein the updateable electronic display is updateable to change the shipping destination information.

7. The system of claim 1, wherein the ruggedized enclosure of the network attachable data transfer device is ruggedized in accordance with one or more standards comprising MIL STD 810 (MIL-SPEC) or IPXX (ingress protection) for dust and water protection.

8. A computing device, comprising:
a ruggedized enclosure;
a storage medium mounted within the ruggedized enclosure; and
a mounting bracket coupled to the ruggedized enclosure, wherein the mounting bracket is configured to:
extend out from the ruggedized enclosure and couple with a rack when the computing device is mounted in the rack; and
stow in a portion of the ruggedized enclosure when the computing device is being transported,
wherein the computing device is configured to be mounted in the rack:
in a first orientation wherein a length of the computing device is oriented along a depth of the rack; and
in a perpendicular orientation wherein the length of the computing device spans a width of the rack.

9. The computing device of claim 8 further comprising:
a coupling mechanism configured to couple the computing device with another device, wherein the coupling mechanism is configured to:
extend out from the ruggedized enclosure and couple the computing device with the other device; and
stow in a portion of the ruggedized enclosure when the computing device is being transported.

10. The computing device of claim 9, wherein the coupling mechanism comprises:
a pin coupled to the ruggedized enclosure via a pivot, wherein the pin is configured to:
fold out of a space in the ruggedized enclosure to extend the pin out from the computing device; and
fold into a space in the ruggedized enclosure to stow the pin in the space in the ruggedized enclosure.

11. The computing device of claim 9, wherein the coupling mechanism comprises:
a hole in the ruggedized enclosure configured to accept a pin extended out from an adjacent computing device to which the computing device is being coupled.

12. The computing device of claim 9, wherein the coupling mechanism is mounted on a first side of the computing device, wherein the computing device further comprises:
a network connection on a back side of the computing device, wherein the back side is oriented perpendicular to the first side,
wherein the network connection is accessible through the enclosure and configured to provide access to the storage medium as a network-attached storage device.

13. The computing device of claim 8, further comprising an additional mounting bracket, wherein the mounting bracket and the additional mounting bracket are coupled to the ruggedized enclosure at opposite ends of a length of the computing device, wherein the length substantially spans a width of a standard rack,
wherein the computing device is configured to mount in a standard rack in an orientation in which the length of the computing device is oriented along the width of the standard rack.

14. The computing device of claim 8, further comprising a cable guide along a corner of the ruggedized enclosure of the computing device, wherein the cable guide is configured to accept and route a cable from a first side of the computing device to a back side of the computing device when the computing device is mounted in a rack.

15. The computing device of claim 8, wherein the computing device further comprises:
an updateable electronic display incorporated into the ruggedized enclosure and visible external to the ruggedized enclosure to provide shipping destination information, wherein the updateable electronic display is updateable to change the shipping destination information.

16. The computing device of claim 8, wherein the ruggedized enclosure of the computing device is ruggedized in accordance with one or more standards comprising MTh STD 810 (MIL-SPEC) or IPXX (ingress protection) for dust and water protection.

17. The computing device of claim 8, wherein the ruggedized enclosure of the computing device is configured such that the computing device is configured to be shipped by a common carrier without additional packing.

18. The computing device of claim 8, wherein the ruggedized enclosure of the computing device is configured such that the computing device is configured to be shipped by a common carrier without additional labeling.

19. A method, comprising:
receiving a computing device enclosed in a ruggedized enclosure, wherein the computing device is configured to be mounted in a rack:
in a first orientation wherein a length of the computing device is oriented along a depth of the rack; and
in a perpendicular orientation wherein the length of computing device spans a width of the rack;
extending mounting brackets out from the ruggedized enclosure of the computing device;
coupling the extended mounting brackets to the rack to mount the computing device in the rack in the perpendicular orientation; and
connecting a network connection of the computing device to a network, wherein the network connection is accessible at or through the ruggedized enclosure of the computing device, and wherein the network connection provides access to a storage medium of the computing device.

20. The method of claim 19, further comprising:
removing the coupled computing device from the rack;
stowing the mounting brackets in the ruggedized enclosure of the computing device; and
shipping the computing device to another location without using additional packaging or additional labeling.

* * * * *